US012195566B2

(12) United States Patent
Sekido et al.

(10) Patent No.: US 12,195,566 B2
(45) Date of Patent: Jan. 14, 2025

(54) FILM, LAMINATE, SEMICONDUCTOR WAFER WITH FILM LAYER, SUBSTRATE FOR MOUNTING SEMICONDUCTOR WITH FILM LAYER, AND SEMICONDUCTOR DEVICE

(71) Applicant: MITSUBISHI GAS CHEMICAL COMPANY, INC., Tokyo (JP)

(72) Inventors: Takahito Sekido, Tokyo (JP); Masashi Okaniwa, Tokyo (JP); Genki Sugiyama, Tokyo (JP); Kentaro Takano, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 529 days.

(21) Appl. No.: 17/620,989

(22) PCT Filed: Jun. 26, 2020

(86) PCT No.: PCT/JP2020/025143
§ 371 (c)(1),
(2) Date: Dec. 20, 2021

(87) PCT Pub. No.: WO2020/262581
PCT Pub. Date: Dec. 30, 2020

(65) Prior Publication Data
US 2022/0332868 A1 Oct. 20, 2022

(30) Foreign Application Priority Data

Jun. 28, 2019 (JP) ................................. 2019-122429

(51) Int. Cl.
| C08F 222/40 | (2006.01) |
| C08F 2/44 | (2006.01) |
| C08F 212/14 | (2006.01) |
| C08J 5/18 | (2006.01) |
| H01L 21/683 | (2006.01) |
| H01L 23/18 | (2006.01) |

(52) U.S. Cl.
CPC .............. *C08F 222/40* (2013.01); *C08F 2/44* (2013.01); *C08F 212/24* (2020.02); *C08J 5/18* (2013.01); *H01L 21/6836* (2013.01); *H01L 23/18* (2013.01)

(58) Field of Classification Search
CPC .......... C08F 222/40; C08F 212/24; C08J 5/18
See application file for complete search history.

(56) References Cited

U.S. PATENT DOCUMENTS

| 4,826,929 | A | 5/1989 | Ryang |
| 6,300,456 | B1 | 10/2001 | Musa |
| 2008/0083995 | A1 | 4/2008 | Osada |
| 2013/0026660 | A1 | 1/2013 | Czubarow et al. |
| 2014/0242757 | A1 | 8/2014 | Yoko et al. |
| 2018/0186952 | A1 | 7/2018 | Takano et al. |
| 2020/0166844 | A1* | 5/2020 | Okada ....................... G03F 7/11 |

FOREIGN PATENT DOCUMENTS

| CN | 108219134 | A | 6/2018 |
| EP | 3 842 863 | A | 6/2021 |
| JP | 2002-30041 | A | 1/2002 |
| JP | 2003-221443 | A | 8/2003 |
| JP | 2006-245242 | A | 9/2006 |
| JP | 2011-157529 | A | 8/2011 |
| JP | 2013-8800 | A | 1/2013 |
| JP | 2013-112730 | A | 6/2013 |
| JP | 2014-521754 | A | 8/2014 |
| JP | 2015-503220 | A | 1/2015 |
| JP | 2016-196548 | A | 11/2016 |
| TW | 201906891 | A | 2/2019 |
| WO | WO2018/212116 | | * 11/2018 |

OTHER PUBLICATIONS

International Search Report and Written Opinion of the International Searching Authority issued in International Patent Application No. PCT/JP2020/025143, dated Sep. 15, 2020, along with an English translation thereof.

* cited by examiner

*Primary Examiner* — Robert C Boyle
(74) *Attorney, Agent, or Firm* — GREENBLUM & BERNSTEIN, P.L.C.

(57) ABSTRACT

A film containing: a propenyl group-containing resin (A) including, at an end of a molecule, a constituent unit represented by the following formula (1); a radical polymerizable resin or compound (B) other than the propenyl group-containing resin (A); and a curing accelerator (C), wherein the radical polymerizable resin or compound (B) includes at least one selected from the group consisting of a maleimide group and a citraconimide group. In the formula (1), —* represents a bonding hand.

33 Claims, No Drawings

FILM, LAMINATE, SEMICONDUCTOR WAFER WITH FILM LAYER, SUBSTRATE FOR MOUNTING SEMICONDUCTOR WITH FILM LAYER, AND SEMICONDUCTOR DEVICE

TECHNICAL FIELD

The present invention relates to a film, a laminate using a film, a semiconductor wafer with a film layer, a substrate for mounting a semiconductor with a film layer, and a semiconductor device. In more detail, the present invention relates to a film that is useful as a pre-applied underfill material.

BACKGROUND ART

In recent years, in association with the downsizing and performance improvement of a semiconductor device, flip chip bonding is getting a lot of attention as a method for mounting a semiconductor chip (hereinafter, may be abbreviated as "a chip") on a substrate for mounting a semiconductor (hereinafter, may be abbreviated as the "substrate"). In the flip chip bonding, a construction method is common in which, after joining the chip and the substrate, the gap between the chip and the substrate is filled with an underfill material, which is then cured. However, due to the downsizing and performance improvement of the semiconductor device, the electrode pitch arranged on the chip has become narrower and the gap between the electrodes has also become narrower. As a result, there have been problems that operability is worsened due to a longer time for filling the underfill material, and that filling failures occur, such as unfilling. In response to this, a construction method has been examined in which, after supplying a pre-applied underfill material to the chip or substrate, the joint of the chip and the substrate and the filling of the underfill material are carried out at the same time.

Since the underfill material is a member that comes into direct contact with the chip and the substrate, as important characteristics required for the underfill material, mention may be made of suppressing the parts unfilled with the underfill material between the underfill material and the chip and substrate (hereinafter, may be referred to as "a low void property") in an environment where the semiconductor device is produced and used, and good adhesiveness between the underfill material and the chip and substrate (hereinafter, may be abbreviated as "chip adhesiveness").

Patent Document 1 describes a pre-applied underfill material that uses a radical polymerizable monomer as the main resin. In this Patent Document 1, there is a description that a silane coupling agent is compounded for the purpose of improving the adhesiveness to the chip.

Patent Document 2 describes an underfill material containing an epoxy resin, an imidazole compound, and a maleimide compound.

Patent Document 3 describes a pre-applied underfill material using an epoxy compound and a carboxyl group containing flux component, and mentions adhesion.

Patent Document 4 describes a resin composition containing a maleimide compound, an epoxy resin, and an epoxy resin curing agent as essential components, and describes that high adherence was obtained in the resin composition after thermosetting.

Patent Document 5 describes a resin composition for printed wiring substrates, the resin composition being a thermosetting resin composition used for forming an insulating layer in a printed wiring substrate, and containing a maleimide compound having a specific structure, a benzoxazine compound, and an inorganic filler (C).

Patent Document 6 describes an adhesive for electronic components, containing an aliphatic epoxy compound and a benzoxazine compound as the curing base compounds, and also containing a phenolic curing agent.

Patent Document 7 describes an adhesive composition containing a thermosetting compound, a polymer including a functional group that is capable of reacting with the thermosetting compound, and a thermosetting agent, wherein the adhesive composition has a melt viscosity at a bonding temperature of 10 Pa·s to 15000 Pa·s, a gelling time at a bonding temperature of 10 seconds or longer, and a gelling time at 240° C. of 1 second to 10 seconds.

Patent Document 8 describes a method for producing a semiconductor device using a sheet-shaped thermosetting resin composition.

In addition, when the joint between a chip and a substrate is carried out via a metal that is easily oxidized, such as solder or copper, a flux component derived from a carboxylic acid or the like may be added to a pre-applied underfill material for the purpose of removing a oxidized layer, which is an inhibiting factor for the joint, and obtaining good metal joint.

CITATION LIST

Patent Document

Patent Document 1: Japanese Translation of PCT International Application Publication No. 2015-503220
Patent Document 2: Japanese Translation of PCT International Application Publication No. 2014-521754
Patent Document 3: Japanese Patent Application Laid-Open No. 2013-112730
Patent Document 4: Japanese Patent Application Laid-Open No. 2003-221443
Patent Document 5: Japanese Patent Application Laid-Open No. 2016-196548
Patent Document 6: Japanese Patent Application Laid-Open No. 2013-008800
Patent Document 7: Japanese Patent Application Laid-Open No. 2011-157529
Patent Document 8: Japanese Patent Application Laid-Open No. 2006-245242

SUMMARY OF INVENTION

Technical Problem

However, radical polymerizable monomers generally cure quickly, and the mobility of the adhesion site of the compounded silane coupling agent is rate-controlled by the main resin that has been polymerized before forming a sufficient number of bonds with the silanol groups on the surface of the chip. As a result, in the pre-applied underfill material described in Patent Document 1, a sufficient low void property and good chip adhesiveness between the chips and substrates such as printed wiring boards and the underfill material cannot be obtained. In addition, since radical polymerizable monomers cure quickly, the resin composition cures before it is embedded in the unevenness present on the surface of the chip. Therefore, there is also a problem that sufficient anchor effect, which is useful in improving adhesiveness, cannot be obtained by the pre-applied underfill material described in Patent Document 1.

Since the material described in Patent Document 2 acts only on the polyimide passivation film, there is a problem that the application range is narrow.

In the technique described in Patent Document 3, reaction between the carboxyl group containing compound and the epoxy compound progresses slightly even at room temperature, and the flux activity is reduced over time during storage. Therefore, the pre-applied underfill material described in Patent Document 3 has problems such as low stability at the joint and poor mass productivity.

In the technique described in Patent Document 4, the water absorption rate of the maleimide resin is high, and thus proposing a problem that the chip adhesiveness after the moisture absorption treatment is significantly lowered. When the adhesiveness is insufficient, water penetrates from the peeling interface and the insulation reliability is greatly reduced. In addition, it is difficult even for the maleimide resin alone to achieve both a low void property and chip adhesiveness.

In Patent Document 5, there is no description about the flux activity, and no description about the flux component, either. Therefore, the resin composition described in Patent Document 5 has a problem that good metal joint cannot be obtained.

In Patent Document 6, although the adhesiveness of the epoxy compound is high, the epoxy compound also reacts with the flux component, thus proposing a problem that flux activity sufficient for obtaining good metal joint cannot be obtained.

The adhesive composition of Patent Document 7 contains a thermosetting agent having a flux property, but in Examples, an epoxy compound and a polymer including an epoxy group are used, and both react at a temperature lower than the bonding temperature. Therefore, it is difficult to obtain sufficient flux activity.

Patent Document 8 also describes that an epoxy resin is suitable as the thermosetting resin contained in the thermosetting resin composition, but as described above, the epoxy compound also reacts with the flux component, thus proposing a problem that flux activity sufficient for obtaining good metal joint cannot be obtained.

The present invention has been made in view of such problems, and an object of the present invention is to provide a film that is excellent in curability, a low void property, and chip adhesiveness, a laminate, a semiconductor wafer with a film layer, a substrate for mounting a semiconductor with a film layer, and a semiconductor device.

Solution to Problem

The present inventors have, as a result of devoted examinations to solve the above problems, found out that a film containing a specific propenyl group-containing resin (A), a specific radical polymerizable resin or compound (B) and a curing accelerator (C) can solve the above problems, and reached the present invention.

More specifically, the present invention includes the following contents.

[1]

A film comprising: a propenyl group-containing resin (A) including, at an end of a molecule, a constituent unit represented by the following formula (1); a radical polymerizable resin or compound (B) other than the propenyl group-containing resin (A); and a curing accelerator (C), wherein the radical polymerizable resin or compound (B) includes at least one selected from the group consisting of a maleimide group and a citraconimide group.

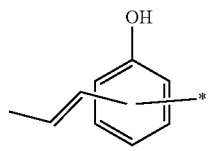

(In the formula (1), —* represents a bonding hand.)

[2]

The film according to [1], wherein the propenyl group-containing resin (A) has a mass average molecular weight of 300 to 10,000.

[3]

The film according to [1] or [2], wherein the propenyl group-containing resin (A) includes a resin represented by the following formula (2).

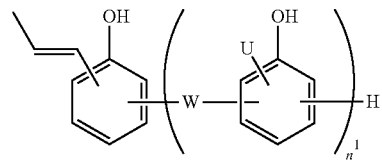

(In the formula (2), each W independently represents a hydrocarbon group having 6 to 15 carbon atoms and optionally having a substituent. Each U independently represents a hydrogen atom or an alkenyl group having 2 to 6 carbon atoms. $n^1$ represents the number of repetitions, and its average value is a real number of 1 to 20.)

[4]

The film according to any of [1] to [3], wherein the propenyl group-containing resin (A) includes a resin represented by the following formula (3).

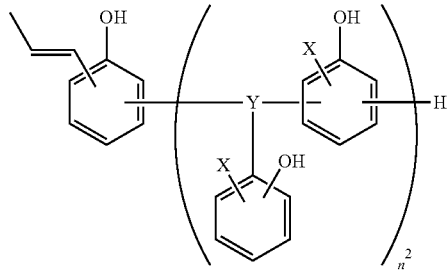

(In the formula (3), each Y independently represents a hydrocarbon group having 1 to 6 carbon atoms. Each X independently represents a hydrogen atom or an alkenyl group having 2 to 6 carbon atoms. $n^2$ represents the number of repetitions, and its average value is a real number of 1 to 20.)

[5]

The film according to any of [1] to [4], wherein the radical polymerizable resin or compound (B) includes at least one selected from the group consisting of 2,2-bis[4-(4-maleimidophenoxy)phenyl]propane, a maleimide compound represented by the following formula (4), a maleimide compound represented by the following formula (5), a maleimide compound represented by the following formula (6), a maleimide compound represented by the following formula (7), a maleimide compound represented by the following formula (8), and a maleimide compound represented by the following formula (9).

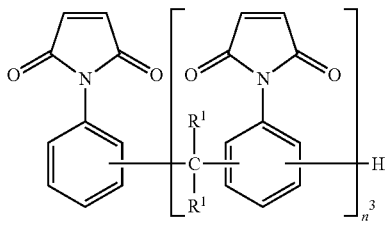

(4)

(In the formula (4), each $R^1$ independently represents a hydrogen atom or a methyl group, and $n^3$ represents an integer of 1 to 10.)

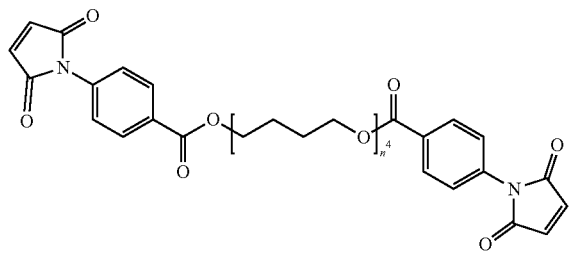

(5)

(In the formula (5), $n^4$ represents an integer of 1 to 30.)

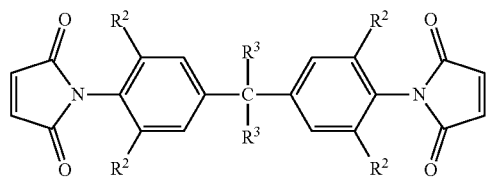

(6)

(In the formula (6), each $R^2$ independently represents a hydrogen atom, a methyl group, or an ethyl group, and each $R^3$ independently represents a hydrogen atom or a methyl group.)

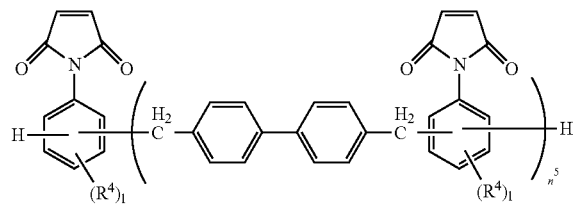

(7)

(In the formula (7), each $R^4$ independently represents a hydrogen atom, an alkyl group having 1 to 5 carbon atoms, or a phenyl group, each $l$ independently represents an integer of 1 to 3, and $n^5$ represents an integer of 1 to 10.)

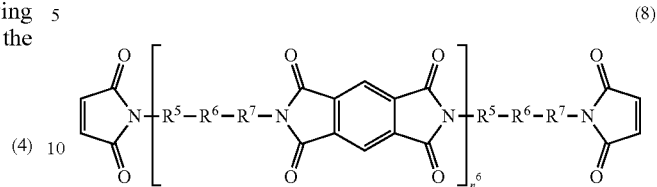

(8)

(In the formula (8), $R^5$ and $R^7$ each independently represent a hydrocarbon group in which 8 or more atoms are linearly linked, each $R^6$ independently represents a substituted or unsubstituted cyclic hydrocarbon group optionally having a heteroatom in which 4 to 10 atoms constitute the ring, and $n^6$ represents an integer of 1 to 10.)

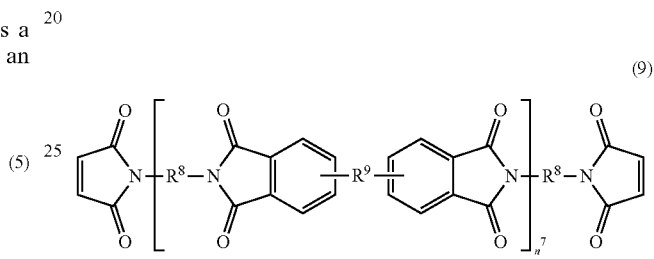

(9)

(In the formula (9), each $R^8$ independently represents an alkylene group, each $R^9$ independently represents an alkylene group, a group represented by the following formula (10), a group represented by the formula "—$SO_2$—", a group represented by "—CO—", a group represented by the following formula (11), an oxygen atom, or a single bond, and $n^7$ represents an integer of 1 to 10.)

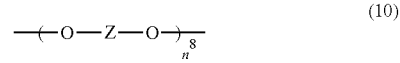

(10)

(In the formula (10), Z is an alkylene group or a hydrocarbon group having 6 to 30 carbon atoms and including an aromatic ring, and $n^8$ represents an integer of 0 to 5.)

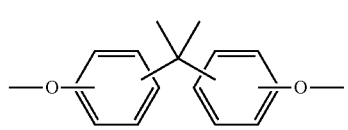

(11)

[6]
The film according to any of [1] to [5], wherein a ratio between propenyl groups in the propenyl group-containing resin (A) and polymerizable functional groups in the radical polymerizable resin or compound (B) (propenyl group: polymerizable functional group) is 1:1 to 1:7.

[7]
The film according to any of [1] to [6], wherein the curing accelerator (C) includes at least one selected from the group consisting of a thermal radical polymerization initiator (D) and an imidazole compound (E).

[8]
The film according to [7], wherein the thermal radical polymerization initiator (D) has a 10 hour half-life period temperature of 100° C. or higher.

[9]
The film according to [7] or [8], wherein the thermal radical polymerization initiator (D) includes an organic peroxide.

[10]
The film according to any of [7] to [9], wherein the thermal radical polymerization initiator (D) includes a peroxy ester, a peroxy ketal, a dialkyl peroxide, or a hydroperoxide skeleton.

[11]
The film according to any of [7] to [10], wherein the thermal radical polymerization initiator (D) includes at least one selected from the group consisting of dicumyl peroxide, di(2-tert-butylperoxyisopropyl)benzene, 1,1,3,3-tetramethylbutyl hydroperoxide, 2,5-dimethyl-2,5-bis(tert-butylperoxy)hexyne-3, and tert-butyl hydroperoxide.

[12]
The film according to any of [1] to [11], wherein a content of the curing accelerator (C) is 0.05 parts by mass to 10 parts by mass based on 100 parts by mass in total of the propenyl group-containing resin (A) and the radical polymerizable resin or compound (B).

[13]
The film according to any of [1] to [12], further comprising a thermosetting compound (F) other than the propenyl group-containing resin (A) and the radical polymerizable resin or compound (B).

[14]
The film according to [13], wherein the thermosetting compound (F) has a molecular weight of 400 or more.

[15]
The film according to [13] or [14], wherein the thermosetting compound (F) includes a benzoxazine compound.

[16]
The film according to [15], wherein the benzoxazine compound includes at least one selected from the group consisting of a compound represented by the following formula (12), a compound represented by the following formula (13), a compound represented by the following formula (14) and a compound represented by the following formula (15).

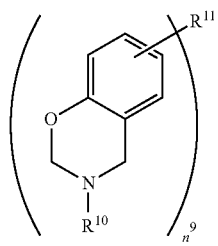
(12)

(In the formula (12), each $R^{10}$ independently represents an aryl group, an aralkyl group, an alkenyl group, an alkyl group, or a cycloalkyl group, $R^{11}$ represents a hydrogen atom, an aryl group, an aralkyl group, an alkenyl group, an alkyl group, a cycloalkyl group, or a monovalent to tetravalent organic group represented by the following general formulas (a) to (t), and $n^9$ represents an integer of 1 to 4.)

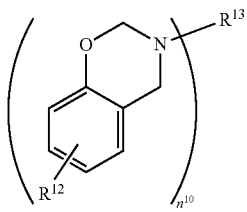
(13)

(In the formula (13), each $R^{12}$ independently represents a hydrogen atom, an aryl group, an aralkyl group, an alkenyl group, an alkyl group, or a cycloalkyl group, $R^{13}$ represents an aryl group, an aralkyl group, an alkenyl group, an alkyl group, a cycloalkyl group, or a monovalent to tetravalent organic group represented by the following general formulas (a) to (t), and $n^{10}$ represents an integer of 1 to 4.)

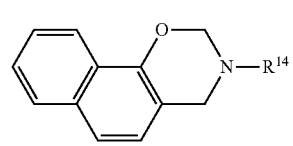
(14)

(In the formula (14), $R^{14}$ represents an alkyl group, a cycloalkyl group, or a phenyl group optionally having a substituent.)

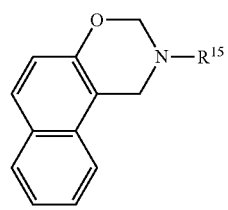
(15)

(In the formula (15), $R^{15}$ represents an alkyl group, a cycloalkyl group, or a phenyl group optionally having a substituent.)

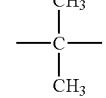
(a)

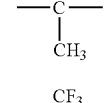
(b)

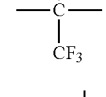
(c)

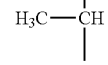
(d)

(e)

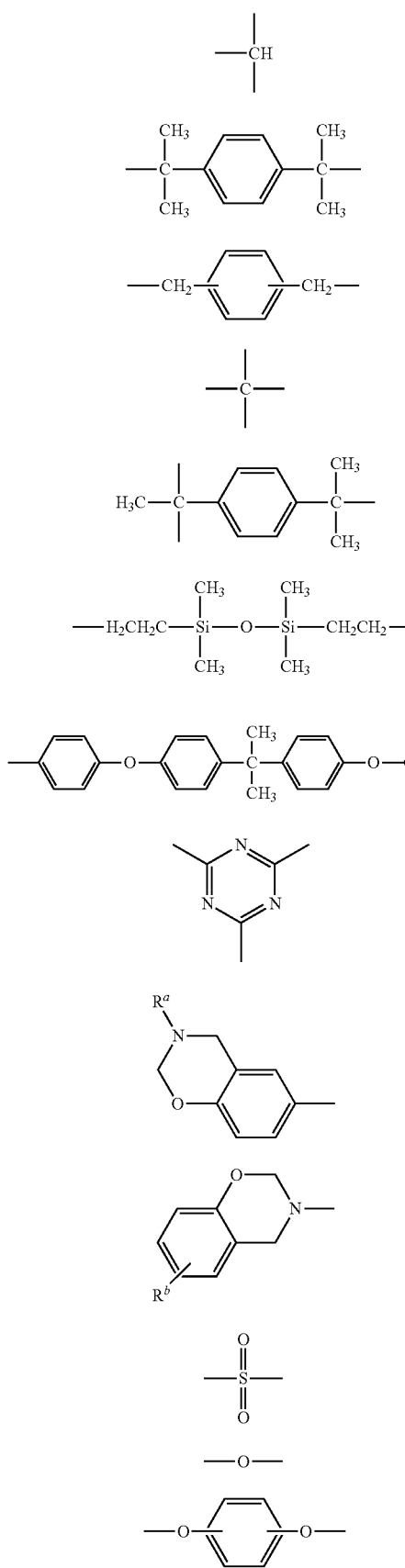

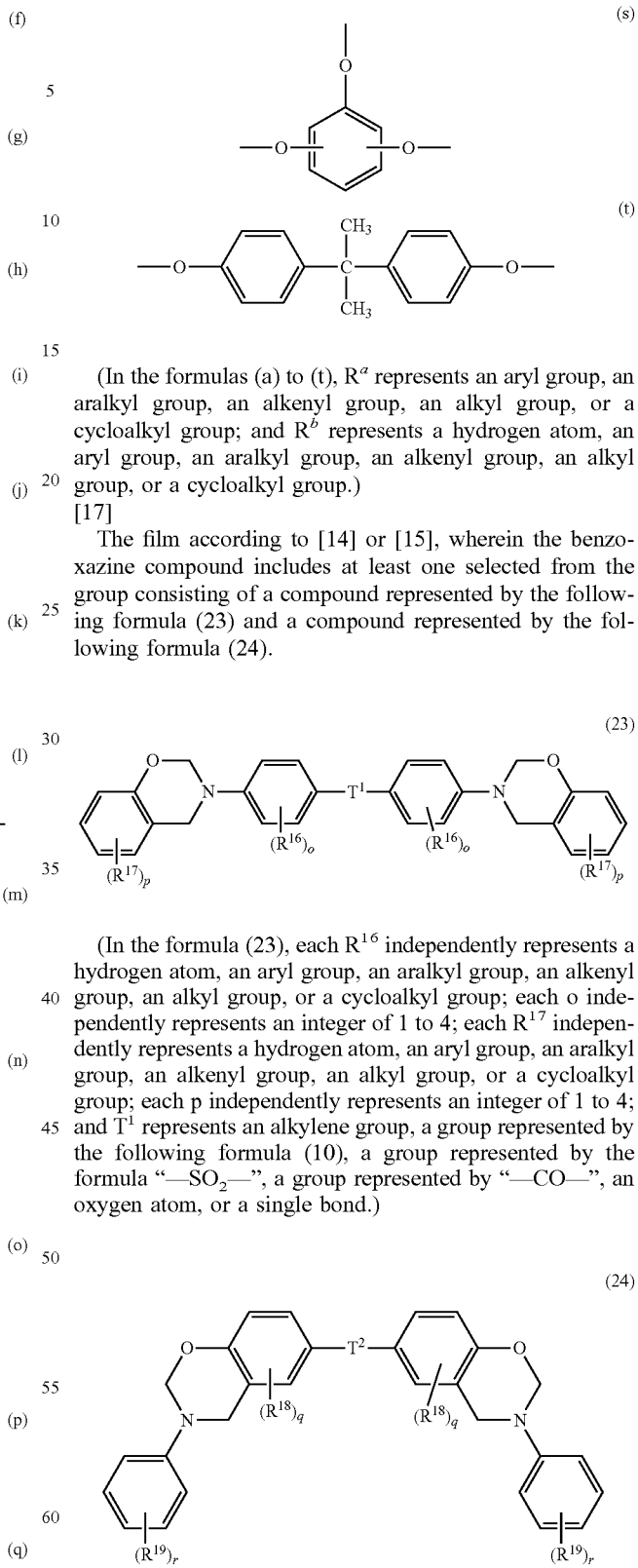

(In the formulas (a) to (t), $R^a$ represents an aryl group, an aralkyl group, an alkenyl group, an alkyl group, or a cycloalkyl group; and $R^b$ represents a hydrogen atom, an aryl group, an aralkyl group, an alkenyl group, an alkyl group, or a cycloalkyl group.)

[17]

The film according to [14] or [15], wherein the benzoxazine compound includes at least one selected from the group consisting of a compound represented by the following formula (23) and a compound represented by the following formula (24).

(In the formula (23), each $R^{16}$ independently represents a hydrogen atom, an aryl group, an aralkyl group, an alkenyl group, an alkyl group, or a cycloalkyl group; each o independently represents an integer of 1 to 4; each $R^{17}$ independently represents a hydrogen atom, an aryl group, an aralkyl group, an alkenyl group, an alkyl group, or a cycloalkyl group; each p independently represents an integer of 1 to 4; and $T^1$ represents an alkylene group, a group represented by the following formula (10), a group represented by the formula "—$SO_2$—", a group represented by "—CO—", an oxygen atom, or a single bond.)

(In the formula (24), each $R^{18}$ independently represents a hydrogen atom, an aryl group, an aralkyl group, an alkenyl group, an alkyl group, or a cycloalkyl group, each q independently represents an integer of 1 to 3, each $R^{19}$ independently represents a hydrogen atom, an aryl group, an aralkyl group, an alkenyl group, an alkyl group, or a cycloalkyl group, each r independently represents an integer of 1 to 5, and $T^2$ represents an alkylene group, a group represented by the following formula (10), a group represented by the formula "—$SO_2$—", a group represented by "—CO—", an oxygen atom, or a single bond.)

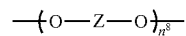
(10)

(In the formula (10), Z is an alkylene group or a hydrocarbon group having 6 to 30 carbon atoms and including an aromatic ring, and $n^8$ represents an integer of 0 to 5.)

[18]
The film according to any of [13] to [17], wherein a content of the thermosetting compound (F) is 1 part by mass to 100 parts by mass based on 100 parts by mass in total of the propenyl group-containing resin (A) and the radical polymerizable resin or compound (B).

[19]
The film according to any of [1] to [18], further comprising an inorganic filler (G).

[20]
The film according to [19], wherein the inorganic filler (G) has an average particle diameter of 3 μm or less.

[21]
The film according to [19] or [20], wherein the inorganic filler (G) includes at least one selected from the group consisting of silica, aluminum hydroxide, alumina, boehmite, boron nitride, aluminum nitride, magnesium oxide, and magnesium hydroxide.

[22]
The film according to any of [19] to [21], wherein the inorganic filler (G) is silica.

[23]
The film according to any of [19] to [22], wherein a content of the inorganic filler (G) is 500 parts by mass or less based on 100 parts by mass in total of the propenyl group-containing resin (A) and the radical polymerizable resin or compound (B).

[24]
The film according to any of [1] to [23], further comprising an organic compound (H) having a flux function.

[25]
The film according to [24], wherein a content of the organic compound (H) having the flux function is 5 parts by mass to 80 parts by mass based on 100 parts by mass in total of the propenyl group-containing resin (A) and the radical polymerizable resin or compound (B).

[26]
The film according to any of [1] to [25], having a thickness of 10 μm to 100 μm.

[27]
The film according to any of [1] to [26], for use in a pre-applied underfill material.

[28]
A laminate comprising: a supporting material; and a layer including the film according to any of [1] to [27] laminated on the supporting material.

[29]
A semiconductor wafer with a film layer, comprising: a semiconductor wafer; and the laminate according to [28] laminated on the semiconductor wafer, wherein the layer including the film is laminated on the semiconductor wafer.

[30]
A substrate for mounting a semiconductor with a film layer, comprising: a substrate for mounting the semiconductor; and the laminate according to [28] laminated on the substrate for mounting the semiconductor, wherein the layer including the film is laminated on the substrate for mounting the semiconductor.

[31]
A semiconductor device, comprising the semiconductor wafer with the film layer according to [29]; and/or the substrate for mounting the semiconductor with the film layer according to [30].

Advantageous Effects of Invention

According to the present invention, a film that is excellent in curability, a low void property, and chip adhesiveness, a laminate, a semiconductor wafer with a film layer, a substrate for mounting a semiconductor with a film layer, and a semiconductor device can be obtained.

DESCRIPTION OF EMBODIMENT

An embodiment for carrying out the present invention (which will be simply referred to as the "present embodiment" hereinafter) will now be described. Note that the present embodiment below is given in order to illustrate the present invention, and the present invention is not limited only to the present embodiment.

The film according to one aspect of the present embodiment contains a specific propenyl group-containing resin (A), a specific radical polymerizable resin or compound (B), and a curing accelerator (C). From the viewpoint of achieving action effects according to the present invention more effectively and reliably, it is preferable that the above film be for pre-applied underfill materials.

Another aspect of the present embodiment is a film further containing a thermosetting compound (F).

Another aspect of the present embodiment is a film further containing an inorganic filler (G).

Another aspect of the present embodiment is a film further containing an organic compound (H) having a flux function.

Note that, in the present embodiment, "(meth)acryloyl" refers to both "acryloyl" and "methacryloyl" corresponding thereto, "(meth)acryl" refers to both "acryl" and "methacryl" corresponding thereto, "(meth)acrylate" refers to both "acrylate" and "methacrylate" corresponding thereto, and "(meth)allyl" refers to both "allyl" and "methallyl" corresponding thereto.

[Film]
The film of the present embodiment is a film used as a pre-applied underfill material suitably used for flip chip bonding of the chip, the film containing: a propenyl group-containing resin (A) including, at an end of the molecule, a constituent unit represented by the formula (1); a radical polymerizable resin or compound (B) other than the propenyl group-containing resin (A); and a curing accelerator (C). The radical polymerizable resin or compound (B) includes at least one selected from the group consisting of a maleimide group and a citraconimide group.

The resin composition of the present embodiment may include at least one of a thermosetting compound (F), an inorganic filler (G), and an organic compound (H) having a flux function.

It is not clear why a film that is excellent in curability, a low void property, and chip adhesiveness and that is suitable for the use for pre-applied underfill materials can be obtained in the present embodiment, but the present inventors presume the reason as follows. In the film of the present embodiment, by virtue of using the propenyl group-containing resin (A) including a propenyl group at an end of the molecule, a reaction between propenyl groups and a reaction of a maleimide group and/or a citraconimide group included in the radical polymerizable resin or compound (B) with a propenyl group are promoted while having a suitable melt viscosity. As a result, the film of the present embodiment has a suitable melt viscosity, and at the same time, the cross-linking density of a cured product is increased due to excellent curability of the film of the present embodiment. Therefore, parts unfilled with the underfill material is suppressed as the film spreads between a chip and substrate and the underfill material. As a result, a low void property and excellent chip adhesiveness can be obtained. In particular, the present inventors have found that in order to suppress voids occurring at the time of thermocompression bonding between a chip and substrate and an underfill material in flip chip bonding, the curing starting temperature and the melt viscosity of the film at a temperature at the time of thermocompression bonding are important. Since the film of the present embodiment has a moderate melt viscosity at a temperature at the time of thermocompression bonding and has excellent curability, a melted resin composition can promptly spread between a substrate and a chip at a curing starting temperature and cure. As a result, a low void property and excellent chip adhesiveness can be obtained according to the film of the present embodiment. Furthermore, it is presumed that when the propenyl group-containing resin (A) includes a hydroxyl group, chip adhesiveness between an adherend, such as a chip and substrate, and the underfill material can be improved.

[Propenyl Group-Containing Resin (A)]

The film of the present embodiment contains a propenyl group-containing resin (A). The propenyl group-containing resin (A) is not particularly limited as long as it includes, at an end of the molecule, a constituent unit represented by the formula (1) as a basic skeleton.

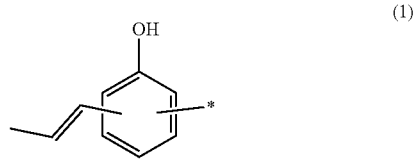

(1)

In the formula (1), represents a bonding hand and it is bonded to the main chain of the polymer.

Since the propenyl group-containing resin (A) includes a highly reactive propenyl group at its end, a reaction between propenyl groups and a reaction of a maleimide group and a citraconimide group with a propenyl group are likely to occur during the curing process. As a result, the crosslinking density of the resulting cured product is increased, a low void property is obtained, and furthermore, heat resistance (glass transition temperature) is also improved. In addition, since it has a polar group, chip adhesiveness between the adherend, such as a chip and substrate, and the underfill material is also improved.

The polymer, which is the main chain of the propenyl group-containing resin (A), is not particularly limited as long as it contains an alkenyl group and a hydroxy group.

The alkenyl group is not particularly limited, but examples thereof include, for example, a vinyl group, a (meth)allyl group, a propenyl group, a butenyl group, and a hexenyl group. Among the above, a propenyl group is preferable.

The polymer is not particularly limited, but examples thereof include, for example, bisphenol A, tetramethyl bisphenol A, diallyl bisphenol A, biphenol, bisphenol F, diallyl bisphenol F, triphenylmethane-based phenol, tetrakisphenol, novolac-based phenol, cresol novolac resins, and polymers including an alkenyl group in the phenol ring, such as phenol including a biphenyl aralkyl skeleton (biphenyl-based phenol). These polymers may have a substituent. Also, these polymers may be used as one kind, or in arbitrary combination of two or more kinds.

Examples of such a substituent include a halogen atom and a linear, branched, or cyclic hydrocarbon group. It is preferable that the linear, branched, or cyclic hydrocarbon group include an alkenyl group as a substituent. The alkenyl group is as described above.

Examples of the halogen atom include a fluorine atom, a chlorine atom, a bromine atom, and an iodine atom.

The linear or branched hydrocarbon group is not particularly limited, but examples thereof include, for example, a methyl group, an ethyl group, a propyl group, an isopropyl group, an n-butyl group, an s-butyl group, an isobutyl group, a t-butyl group, an n-pentyl group, an isopentyl group, a t-pentyl group, an n-hexyl group, an isohexyl group, an s-hexyl group, and a t-hexyl group.

The cyclic hydrocarbon group is not particularly limited, but examples thereof include, for example, an aliphatic cyclic hydrocarbon group and an aromatic hydrocarbon group. Examples of the aliphatic cyclic hydrocarbon group include, for example, a monocyclic aliphatic hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic hydrocarbon group such as a bicyclo[2.2.2]octanyl group, a tricyclo[5.2.1.0$^{2,6}$]decanyl group, a tricyclo[3.3.1.1$^{3,7}$]decanyl group, a tetracyclo[6.2.1.1$^{3,6}$.0$^{2,7}$]dodecanyl group, and an adamantyl group. Examples of the aromatic hydrocarbon group include a group obtained by removing one hydrogen atom from an aromatic hydrocarbon ring such as benzene, biphenyl, fluorene, naphthalene, anthracene, and phenanthrene.

In the propenyl group-containing resin (A), from the viewpoint of preventing voids due to volatilization of the propenyl group-containing resin (A) during the flip chip bonding, the mass average molecular weight of the propenyl group-containing resin (A) is, not particularly limited to, preferably 300 to 10,000, more preferably 400 to 7,000, and still more preferably 1,000 to 3,000 in terms of polystyrene by the gel permeation chromatography (GPC) method.

It is preferable that the propenyl group-containing resin (A) include a resin represented by formula (2). When the film of the present embodiment contains such a propenyl group-containing resin (A), excellent heat resistance can be obtained.

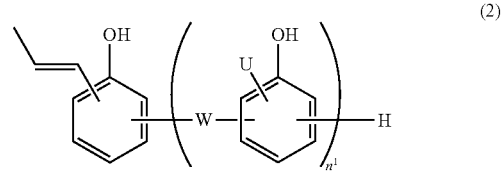

(2)

In the formula (2), each W independently represents a hydrocarbon group having 6 to 15 carbon atoms and optionally having a substituent. Each U independently represents a hydrogen atom or an alkenyl group having 2 to 6 carbon atoms. $n^1$ represents the number of repetitions, and its average value is a real number of 1 to 20.

In the formula (2), each W independently represents a hydrocarbon group having 6 to 15 carbon atoms and optionally having a substituent. It is preferable that the substituent in W contain an aromatic ring, and in this case, it is preferable for the propenyl group-containing resin (A) to be represented by formula (3).

In addition, W in the formula (2) is preferably an aromatic hydrocarbon group, and is more preferably an aromatic hydrocarbon group having 10 to 15 carbon atoms. W is not particularly limited, but for example, mention may be made of the following structures. These structures may be used as one kind, or in arbitrary combination of two or more kinds.

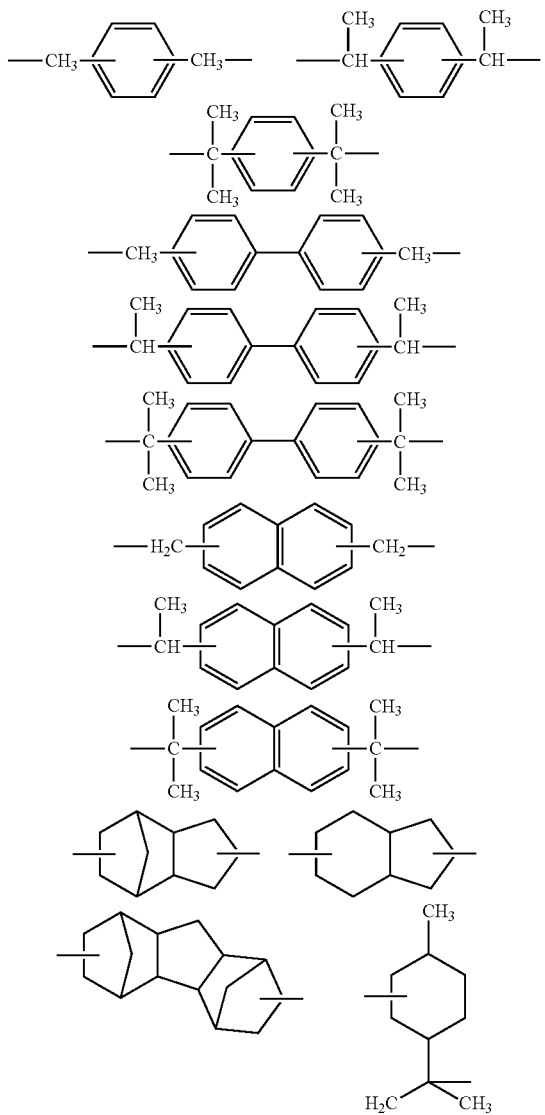

Among the above, it is preferable for W to include an alkyl-based biphenyl skeleton from the standpoint of heat resistance.

In the formula (2), with respect to the number of the alkenyl groups in the molecule, it is preferable that 20% or more of the alkenyl groups in the molecule be propenyl groups based on the total of U and the terminal propenyl group. In the formula (2), it is preferable that 40% or more of the alkenyl groups in the molecule be propenyl groups, and it is more preferable that 60% or more of them be propenyl groups. The upper limit is not particularly limited, but is 100% or less. When the alkenyl groups in the molecule are in the range described above, excellent curability can be obtained.

In the formula (2), each U other than the propenyl group independently represents a hydrogen atom or an alkenyl group having 2 to 6 carbon atoms. Examples of the alkenyl group having 2 to 6 carbon atoms include a vinyl group, a (meth)allyl group, a butenyl group, and a hexenyl group. U other than the propenyl group is preferably a hydrogen atom from the standpoint that the curability can be controlled suitably.

In the formula (2), $n^1$ represents the number of repetitions, and its average value is a real number of 1 to 20. From the standpoint that the curability can be suitably controlled, it is preferable that the average value of $n^1$ be a real number of 1 to 10, and it is more preferable that the average value thereof be a real number of 1 to 6.

When W in the formula (2) contains an aromatic ring as a substituent, it is preferable for the propenyl group-containing resin (A) to be represented by formula (3).

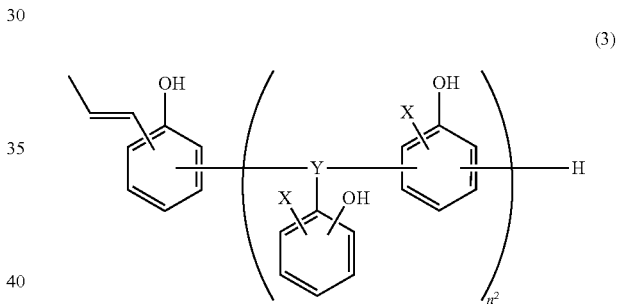

(3)

In the formula (3), each Y independently represents a hydrocarbon group having 1 to 6 carbon atoms. Each X independently represents a hydrogen atom or an alkenyl group having 2 to 6 carbon atoms. $n^2$ represents the number of repetitions, and its average value is a real number of 1 to 20.

In the formula (3), each Y independently represents a divalent hydrocarbon group having 1 to 6 carbon atoms. Y is a structure in which one of the hydrogen atoms in a divalent hydrocarbon group having 1 to 6 carbon atoms is replaced with a phenol ring including an alkenyl group. Y is not particularly limited, but it is preferable that it be a linear, branched, or cyclic divalent hydrocarbon group having 1 to 6 carbon atoms.

The linear hydrocarbon group is not particularly limited, but examples thereof include, for example, a methylene group, an ethylene group, a propylene group, a butylene group, a pentylene group, and a hexylene group. Examples of the branched hydrocarbon group include, for example, an alkylmethylene group such as —C(CH$_3$)$_2$—, —CH(CH$_3$)—, —CH(CH$_2$CH$_3$)—, —C(CH$_3$)(CH$_2$CH$_3$)—, —C(CH$_3$)(CH$_2$CH$_2$CH$_3$)—, and —C(CH$_2$CH$_3$)$_2$—; and an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$) CH$_2$—, and —C(CH$_2$CH$_3$)$_2$—CH$_2$—.

The cyclic hydrocarbon group is not particularly limited, but examples thereof include, for example, a cyclopropylene group, a cyclobutylene group, a cyclopentylene group, and a cyclohexylene group.

These hydrocarbon groups may be used as one kind, or in arbitrary combination of two or more kinds.

Among the above, Y is preferably a methylene group from the standpoint that good compatibility with another resin such as a radical polymerizable resin or compound (B), which will be mentioned later, can be obtained.

In the formula (3), with respect to the number of the alkenyl groups in the molecule, it is preferable that 20% or more of the alkenyl groups in the molecule be propenyl groups based on the total of X and the terminal propenyl group. In the formula (3), it is preferable that 40% or more of the alkenyl groups in the molecule be propenyl groups, and it is more preferable that 60% or more of them be propenyl groups. The upper limit is not particularly limited, but is 100% or less. When the alkenyl groups in the molecule are in the above range, excellent curability can be obtained.

In the formula (3), each X other than the propenyl group independently represents a hydrogen atom or an alkenyl group having 2 to 6 carbon atoms. The alkenyl group having 2 to 6 carbon atoms is as described above. From the standpoint that the curability can be controlled suitably, U other than the propenyl group is preferably a hydrogen atom.

In the formula (2), $n^2$ represents the number of repetitions, and its average value is a real number of 1 to 20. From the standpoint that the curability can be suitably controlled, it is preferable that the average value of $n^1$ be a real number of 1 to 10, and it is more preferable that the average value thereof be a real number of 1 to 6.

The method for producing the propenyl group-containing resin (A) represented by the formula (2) or the formula (3) is not particularly limited and it can be produced by a publicly known method.

Examples of the production method include, for example, a method in which a phenolic resin is used as a raw material. The phenolic resin is not particularly limited, but examples thereof include bisphenol A, tetramethyl bisphenol A, diallyl bisphenol A, biphenol, bisphenol F, diallyl bisphenol F, triphenylmethane-based phenol, tetrakisphenol, novolac-based phenol, cresol novolac resins, phenol including a biphenyl aralkyl skeleton (biphenyl-based phenol), and phenol including a triphenylmethane skeleton (triphenylmethane-based phenol).

In the production method, the hydroxyl group in these phenolic resins is allylated to synthesize an allyl ether body, and then the obtained allyl ether group is subjected to a transfer reaction to a propenyl ether group, thereby obtaining the propenyl group-containing resin (A). Alternatively, the propenyl group-containing resin (A) can also be obtained by subjecting the resulting allyl ether group to a Claisen transfer reaction to obtain an allylated phenol, followed by a transfer reaction of the allyl group to a propenyl group according to a publicly known method.

As the propenyl group-containing resin (A), a propenyl group-containing resin containing a structure represented by formula (25) and a propenyl group-containing resin containing a structure represented by formula (26) are preferable. As such a propenyl group-containing resin (A), a commercially available product may be used. Examples of the propenyl group-containing resin containing a structure represented by the formula (25) include, for example, BPN01-S (trade name, mass average molecular weight: 1830) manufactured by Gun Ei Chemical Industry Co., Ltd., and examples of the propenyl group-containing resin containing a structure represented by formula (26) include TPMP01 (trade name, mass average molecular weight: 2371) manufactured by Gun Ei Chemical Industry Co., Ltd.

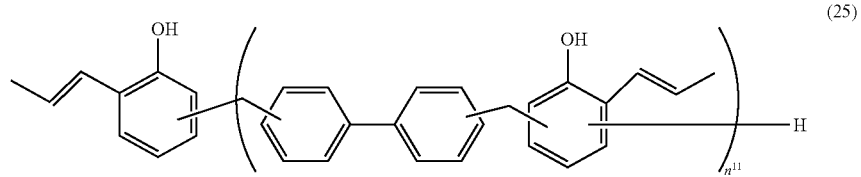

(25)

The formula (25) is a mixture wherein $n^{11}$ is 1 to 10.

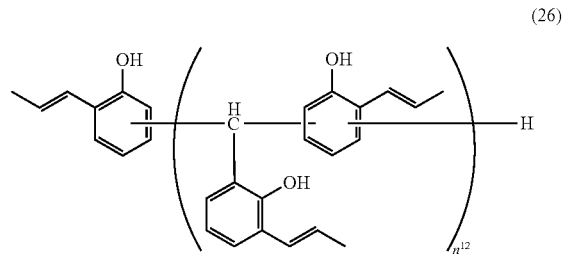

(26)

The formula (26) is a mixture wherein $n^{12}$ is 1 to 10.

[Radical Polymerizable Resin or Compound (B)]

From the standpoint that excellent insulation reliability and heat resistance can be obtained, the film of the present embodiment contains a radical polymerizable resin or compound (B) containing, in the molecule, at least one selected from the group consisting of a maleimide group and a citraconimide group unlike in the case of the propenyl group-containing resin (A). The radical polymerizable resin or compound (B) is not particularly limited as long as it exhibits reactivity with the propenyl group-containing resin (A) together with a curing accelerator (C), which will be mentioned later. As for the radical polymerizable resin or compound (B), it is preferable that it does not exhibit reactivity with an organic compound (H) having a flux function, which will be mentioned later. These radical polymerizable resins or compounds (B) can be used as one kind, or can be used in a mixture of two or more kinds.

It is more preferable that the radical polymerizable resin or compound (B) include a maleimide group in the molecule from the standpoint that excellent reactivity with the propenyl group-containing resin (A) can be obtained and excellent insulation reliability and heat resistance can also be obtained.

It is not clear why a maleimide compound is preferable, but the present inventors presume the reason as follows. That is, since maleimide compounds have superior reactivity with the propenyl group-containing resin (A), excellent curability can be obtained, and crosslinking densities of cured products are increased. Thus, parts unfilled with the underfill material between a chip and substrate and the underfill material is suppressed, and a low void property can be obtained. The present inventors also presume that superior insulation reliability and heat resistance can also be obtained thereby.

The radical polymerizable resin or compound (B) including a maleimide group is not particularly limited as long as it is a resin or compound including one or more maleimide groups in the molecule. The radical polymerizable resin or compound (B) including a maleimide group can be used as one kind, or can be used in a mixture of two or more kinds.

Examples thereof include N-phenylmaleimide, N-hydroxyphenylmaleimide, bis(4-maleimidophenyl)methane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, p-phenylenecitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, polyphenylmethanemaleimide, a novolac-based maleimide compound, a biphenyl aralkyl-based maleimide compound, 2,2-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by formula (4), a maleimide compound represented by formula (5), a maleimide compound represented by formula (6), a maleimide compound represented by formula (7), a maleimide compound represented by formula (8), and a maleimide compound represented by formula (9). The radical polymerizable resin or compound (B) including a maleimide group may also be contained in the film in the form of, for example, a prepolymer obtained by polymerizing the maleimide compound or a prepolymer obtained by polymerizing the maleimide compound with another compound such as an amine compound.

Among the above, from the viewpoint of solubility in an organic solvent, 2,2-bis[4-(4-maleimidophenoxy)phenyl]propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by formula (4), a maleimide compound represented by formula (5), a maleimide compound represented by formula (6), a maleimide compound represented by formula (7), a maleimide compound represented by formula (8), and a maleimide compound represented by formula (9) are preferable, and 2,2-bis[4-(4-maleimidophenoxy)phenyl]propane, a maleimide compound represented by formula (4), a maleimide compound represented by formula (5), a maleimide compound represented by formula (6), a maleimide compound represented by formula (7), a maleimide compound represented by formula (8), and a maleimide compound represented by formula (9) are more preferable. As the maleimide compound represented by formula (6), bis-(3-ethyl-5-methyl-4-maleimidophenyl)methane is preferable.

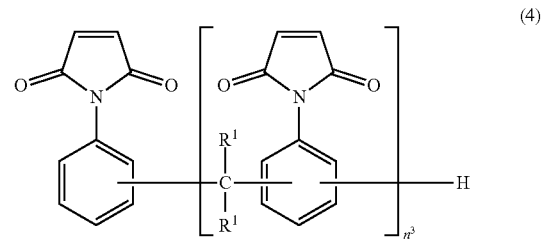

(4)

In the formula (4), each $R^1$ independently represents a hydrogen atom or a methyl group, and from the viewpoint of achieving action effects according to the present embodiment more effectively and reliably, it is preferably a hydrogen atom. In addition, in the formula (4), $n^3$ represents an integer of 1 to 10. For the upper limit value of $n^3$, it is preferable that the upper limit value should be 7 from the viewpoint of solubility in an organic solvent.

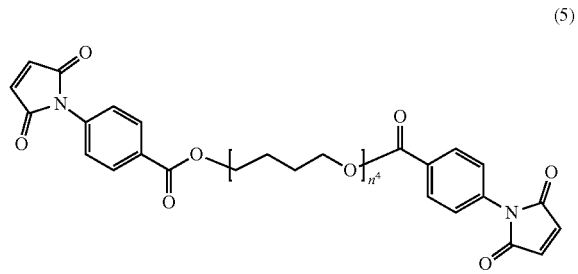

(5)

In the formula (5), $n^4$ represents an integer of 1 to 30. From the viewpoint of achieving action effects according to the present embodiment more effectively and reliably, $n^4$ is preferably an integer of 7 to 30 and more preferably an integer of 7 to 18.

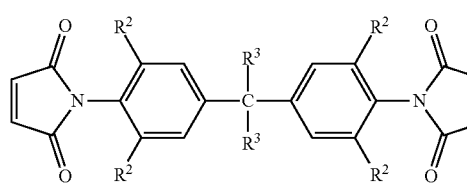

(6)

In the formula (6), each $R^2$ independently represents a hydrogen atom, a methyl group, or an ethyl group.

In the formula (6), each $R^3$ independently represents a hydrogen atom or a methyl group.

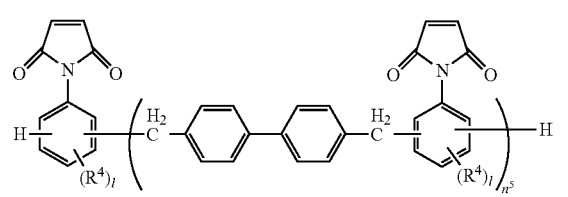

(7)

In the formula (7), each $R^4$ independently represents a hydrogen atom, an alkyl group having 1 to 5 carbon atoms, or a phenyl group, each l independently represents an integer of 1 to 3, and $n^5$ represents an integer of 1 to 10.

Examples of the alkyl group having 1 to 5 carbon atoms include, for example, a methyl group, an ethyl group, an n-propyl group, an isopropyl group, an n-butyl group, an isobutyl group, a sec-butyl group, a t-butyl group, an n-pentyl group, and a neopentyl group. The maleimide compound represented by the formula (7) is preferable since it can reduce an elastic modulus of a cured product obtained by curing the film.

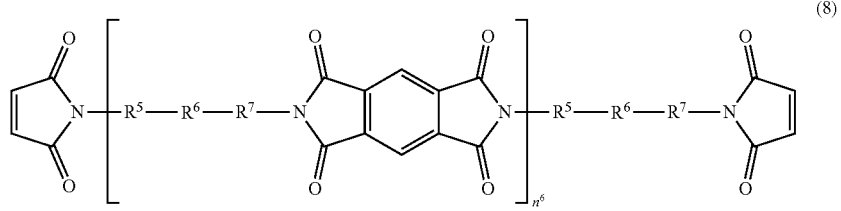

(8)

In the formula (8), $R^5$ and $R^7$ each independently represent a hydrocarbon group in which 8 or more atoms are linearly linked. Each $R^6$ independently represents a substituted or unsubstituted cyclic hydrocarbon group optionally having a heteroatom in which 4 to 10 atoms constitute the ring. $n^6$ represents an integer of 1 to 10.

For both $R^5$ and $R^7$, examples of the hydrocarbon group in which 8 or more atoms are linearly linked include, for example, a substituted or unsubstituted divalent hydrocarbon group having 8 or more carbon atoms. The substituted or unsubstituted divalent hydrocarbon group is not particularly limited, but examples thereof include a substituted or unsubstituted linear aliphatic hydrocarbon group, a substituted or unsubstituted branched aliphatic hydrocarbon group, and a substituted or unsubstituted cycloaliphatic hydrocarbon group. Examples thereof include, for example, an octylene group, a nonamethylene group, a decamethylene group, a dodecamethylene group, a hexadecamethylene group, and an octadecamethylene group.

In $R^6$, examples of the substituted or unsubstituted cyclic hydrocarbon group optionally having a heteroatom in which 4 to 10 atoms constitute the ring include, for example, a substituted or unsubstituted alicyclic group in which 4 to 10 atoms constitute the ring, a substituted or unsubstituted aromatic group in which 4 to 10 atoms constitute the ring, and a substituted or unsubstituted heterocyclic group in which 4 to 10 atoms constitute the ring. Note that the number of atoms constituting the ring means the number of atoms linked in a cyclic manner, and does not include the number of atoms of side chain substituents and the like. Examples of the group of the alicyclic part in the substituted or unsubstituted alicyclic group include, for example, a divalent group or group with 2 or more valences such as a cyclobutyl group, a cyclopentyl group, a cyclohexyl group, a cyclooctyl group, and a cyclodecyl group. In addition, when the substituent is an alkyl group, the alkyl group is not particularly limited, but is an alkyl group having 1 to 10 carbon atoms is preferable, and an alkyl group having 3 to 10 carbon atoms is more preferable. Examples of the alkyl group having 1 to 10 carbon atoms include, for example, a methyl group, an ethyl group, an n-propyl group, an isopropyl group, an n-butyl group, an isobutyl group, a sec-butyl group, a t-butyl group, an n-pentyl group, a neopentyl group, an n-hexyl group, a thexyl group, an n-heptyl group, an n-octyl group, an n-ethylhexyl group, an n-nonyl group, and an n-decyl group. The alkyl group for the alkyl group substitution may be one, or may be two or more.

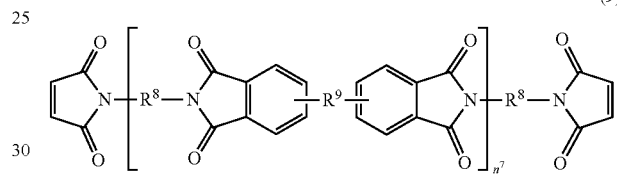

(9)

In the formula (9), each $R^8$ independently represents an alkylene group. Each $R^9$ independently represents an alkylene group, a group represented by formula (10), a group represented by the formula "—$SO_2$—", a group represented by "—CO—", a group represented by formula (11), an oxygen atom, or a single bond. $n^7$ represents an integer of 1 to 10.

For both $R^8$ and $R^9$, the alkylene group is as described above.

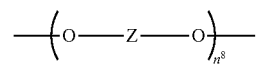

(10)

In the formula (10), Z is an alkylene group or a hydrocarbon group having 6 to 30 carbon atoms and including an aromatic ring. $n^8$ represents an integer of 0 to 5. $n^8$ is preferably an integer of 1 to 3, and more preferably 1 or 2.

In Z, the alkylene group and the hydrocarbon group including an aromatic ring and having 6 to 30 carbon atoms are as described above.

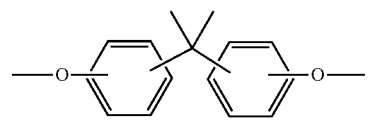

(11)

From the viewpoint of good solubility in an organic solvent and flexibility, the radical polymerizable resin or compound (B) including a maleimide group is preferably the maleimide compound represented by the formula (5), it is more preferable that the radical polymerizable resin or compound (B) further include at least one maleimide compound selected from the group consisting of 2,2-bis(4-(4-maleimidophenoxy)phenyl)propane), the maleimide compound represented by the formula (6), and the maleimide compound represented by the formula (7), together with the maleimide compound represented by the formula (5), and it is still more preferable that the radical polymerizable resin or compound (B) include all of the maleimide compound represented by the formula (5), 2,2-bis(4-(4-maleimidophenoxy)phenyl)propane), the maleimide compound represented by the formula (6), and the maleimide compound represented by the formula (7).

In addition, as described above, in order to suppress voids occurring at the time of thermocompression bonding between a chip and substrate and an underfill material in flip chip bonding, the curing starting temperature and the melt viscosity of the film at a temperature at the time of thermocompression bonding are important. In this regard, from the viewpoint of having a moderate melt viscosity at a temperature at the time of thermocompression bonding and having excellent curability, as the radical polymerizable resin or compound (B) including a maleimide group, it is preferable that the maleimide compound represented by the formula (7) be used together with the propenyl group-containing resin (A), it is more preferable that the radical polymerizable resin or compound (B) further include at least one maleimide compound selected from the group consisting of 2,2-bis(4-(4-maleimidophenoxy)phenyl)propane), the maleimide compound represented by the formula (5), and the maleimide compound represented by the formula (6), together with the propenyl group-containing resin (A) and the maleimide compound represented by the formula (7), and it is still more preferable that the radical polymerizable resin or compound (B) include all of the propenyl group-containing resin (A), the maleimide compound represented by the formula (5), 2,2-bis(4-(4-maleimidophenoxy)phenyl)propane), the maleimide compound represented by the formula (6), and the maleimide compound represented by the formula (7). Since the film of the present embodiment contains the propenyl group-containing resin (A) and such a radical polymerizable resin or compound (B) including a maleimide group, the film of the present embodiment enables a melted resin composition to more promptly spread between a substrate and a chip and cure, and a low void property and excellent adhesiveness can be obtained, the film of the present embodiment is preferable.

As the radical polymerizable resin or compound (B) including a maleimide group, those commercially available may be used, and examples of 2,2'-bis(4-(4-maleimidophenoxy)phenyl)propane include, for example, BMI-80 (trade name) manufactured by K·I Chemical Industry Co., Ltd. Examples of the maleimide compound represented by the formula (4) include, for example, BMI-2300 (trade name) manufactured by Daiwa Kasei Industry Co., LTD. Examples of the maleimide compound represented by the formula (5) include, for example, BMI-1000P (trade name, $n_4$=14 (average) in the formula (5)) manufactured by K·I Chemical Industry Co., LTD., BMI-650P (trade name, $n_4$=9 (average) in the formula (5)) manufactured by K·I Chemical Industry Co., LTD., BMI-250P (trade name, $n_4$=3 to 8 (average) in the formula (5)) manufactured by K·I Chemical Industry Co., LTD., and CUA-4 (trade name, $n_4$=1 in the formula (5)) manufactured by K·I Chemical Industry Co., LTD. Examples of the maleimide compound represented by the formula (6) include, for example, BMI-70 (trade name) manufactured by K·I Chemical Industry Co., LTD. Examples of the maleimide compound represented by the formula (7) include, for example, MIR-3000-70MT (trade name, a mixture wherein all $R^4$ are hydrogen atoms and $n^5$ is 1 to 10 in the formula (7)) manufactured by Nippon Kayaku Co., Ltd. Examples of the maleimide compound represented by the formula (8) include, for example, BMI-5000 (trade name) manufactured by Designer Molecules Inc. Examples of the maleimide compound represented by the formula (9) include, for example, BMI-6000 (trade name) manufactured by Designer Molecules Inc.

The radical polymerizable resin or compound (B) including a citraconimide group as a radical polymerizable group is not particularly limited as long as it is a resin or compound including one or more citraconimide groups in the molecule. Examples thereof include, for example, o-phenylenebiscitraconimide, m-phenylenebiscitraconimide, p-phenylenebiscitraconimide, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, 1,3-xylylenebis(citraconimide), N-[3-bis(trimethylsilyl)amino-1-propyl]citraconimide, N-[3-bis(triethylsilyl)amino-1-propyl]citraconimide, N-[3-bis(triphenylsilyl)amino-1-propyl]citraconimide, N,N'-(m-phenylenedimethylene)dicitraconimide, and N-[3-(methylidenesuccinimidomethyl)benzyl]citraconimide. The resin or compound (B) including a citraconimide group can be used as one kind, or can be used in a mixture of two or more kinds.

In the film of the present embodiment, from the standpoint that superior curability, a low void property, and chip adhesiveness can be obtained, the ratio between propenyl groups in the propenyl group-containing resin (A) and polymerizable functional groups in the radical polymerizable resin or compound (B) (propenyl group:polymerizable functional group) is preferably 1:1 to 1:7, more preferably 1:1.3 to 1:5, and still more preferably 1:1.5 to 1:4. Note that the polymerizable functional group in the radical polymerizable resin or compound (B) represents the maleimide group and/or citraconimide group. In addition, in the present embodiment, the ratio (propenyl group:polymerizable functional group) is calculated using the amount of propenyl groups in the propenyl group-containing resin (A) (hereinafter, referred to as the "propenyl group amount") and the amount of polymerizable functional group in the radical polymerizable resin or compound (B) (hereinafter, referred to as the "polymerizable functional group amount"). The propenyl group amount is calculated by dividing the compounded amount of the propenyl group-containing resin (A) by the functional group equivalent of the propenyl group-containing resin (A). The polymerizable functional group amount is calculated by dividing the compounded amount of the radical polymerizable resin or compound (B) by the functional group equivalent of the radical polymerizable resin or compound (B). When a plurality of propenyl group-containing resins (A) is present, the propenyl group amounts for the respective resins are calculated by the above-described calculation method, and the amount obtained by summing these amounts is taken as the propenyl group amount. Similarly, when a plurality of radical polymerizable resins or compounds (B) is present, the polymerizable functional group amounts for the respective resins or compounds are calculated by the above-described calculation method, and the amount obtained by summing these amounts is taken as the polymerizable functional group amount.

When the film of the present embodiment contains the maleimide compound represented by the formula (5) as the radical polymerizable resin or compound (B) including a maleimide group, from the standpoint that good solubility in an organic solvent and good flexibility can be obtained, the maleimide compound represented by the formula (5) is preferably contained in an amount of 5 parts by mass to 60 parts by mass and more preferably contained in an amount of 25 parts by mass to 55 parts by mass based on 100 parts by mass in total of the propenyl group-containing resin (A) and the radical polymerizable resin or compound (B) including a maleimide group, but the amount of the maleimide compound represented by the formula (5) is not particularly limited thereto.

In the film of the present embodiment, when the radical polymerizable resin or compound (B) including a maleimide group includes the maleimide compound represented by the formula (5), 2,2-bis(4-(4-maleimidophenoxy)phenyl)propane, the maleimide compound represented by the formula (6), and the maleimide compound represented by the formula (7), from the standpoint that superior curability and a low void property and superior chip adhesiveness can be obtained, the propenyl group-containing resin (A), the maleimide compound represented by the formula (5), 2,2-bis(4-(4-maleimidophenoxy)phenyl), the maleimide compound represented by the formula (6), and the maleimide compound represented by the formula (7) are contained in amounts of 10 parts by mass to 35 parts by mass, 25 parts by mass to 55 parts by mass, 2 parts by mass to 25 parts by mass, 2 parts by mass to 25 parts by mass, and 15 parts by mass to 40 parts by mass, respectively, based on 100 parts by mass in total of the propenyl group-containing resin (A) and the radical polymerizable resin or compound (B) including a maleimide group, but the amounts thereof are not particularly limited thereto.

[Curing Accelerator (C)]

From the standpoint that curing speed can be suitably adjusted and an excellent low void property can be obtained, the film of the present embodiment contains a curing accelerator (C). The curing accelerator (C) is not particularly limited as long as it is a compound capable of accelerating curing of the propenyl group-containing resin (A) and the radical polymerizable resin or compound (B). The curing accelerator (C) can be used as one kind, or can be used in a mixture of two or more kinds.

The curing accelerator (C) is not particularly limited, but examples thereof include, for example, a thermal radical polymerization initiator (D), an imidazole compound (E), and a tertiary amine such as triethylamine and tributylamine. Among the above, from the standpoint that good curing speed can be obtained, it is preferable that at least one selected from the group consisting of a thermal radical polymerization initiator (D) and an imidazole compound (E) be included, and it is more preferable that the thermal radical polymerization initiator (D) and imidazole compound (E) be both included.

In the present embodiment, the content of the curing accelerator (C) is not particularly limited, but from the standpoint that good curing speed can be obtained, the curing accelerator (C) is preferably contained in an amount of 0.05 parts by mass to 10 parts by mass, and more preferably contained in an amount of 0.05 parts by mass to 8 parts by mass based on 100 parts by mass in total of the propenyl group-containing resin (A) and the radical polymerizable resin or compound (B).

(Thermal Radical Polymerization Initiator (D))

The thermal radical polymerization initiator (D) is not particularly limited as long as it is a compound releasing an active substance (radical) capable of polymerizing, by heat, the propenyl group of the propenyl group-containing resin (A) and the polymerizable functional group of the radical polymerizable resin or compound (B), and publicly known thermal radical polymerization initiators can be used. The radical polymerization initiator (D) can be used as one kind, or can be used in a mixture of two or more kinds.

In the present embodiment, although the 10 hour half-life period temperature of the thermal radical polymerization initiator (D) is not particularly limited, it is preferably 100° C. or higher, and is more preferably 110° C. or higher from the viewpoint of producibility. In the present embodiment, it is preferable that the 10 hour half-life period temperature of the thermal radical polymerization initiator (D) satisfy the range described above since the temperature during the solvent removal step upon production can be increased.

Examples of the thermal radical polymerization initiator (D) include, for example, an organic peroxide including a ketone peroxide such as dicumyl peroxide, di(2-tert-butylperoxyisopropyl)benzene, 1,1,3,3-tetramethylbutyl hydroperoxide, 2,5-dimethyl-2,5-bis(tert-butylperoxy)hexyne-3, benzoyl peroxide, di-t-butyl peroxide, methyl ethyl ketone peroxide, and cyclohexanone peroxide; a peroxy ketal such as 1,1-di(t-butylperoxy)cyclohexane and 2,2-di(4,4-di(t-butylperoxy)cyclohexyl)propane; a hydroperoxide such as tert-butyl hydroperoxide, p-menthane hydroperoxide, diisopropylbenzene hydroperoxide, cumene hydroperoxide, and t-butyl hydroperoxide; a dialkyl peroxide such as di(2-t-butylperoxyisopropyl)benzene, 2,5-dimethyl-2,5-di(t-butylperoxy)hexane, t-butyl cumyl peroxide, di-t-hexyl peroxide, 2,5-dimethyl-2,5-di(t-butylperoxy)hexyne-3, and di-t-butyl peroxide; a diacyl peroxide such as dibenzoyl peroxide and di(4-methylbenzoyl) peroxide; a peroxy dicarbonate such as di-n-propyl peroxydicarbonate and diisopropyl peroxydicarbonate; a peroxy ester such as 2,5-dimethyl-2,5-di(benzoylperoxy)hexane, t-hexyl peroxybenzoate, t-butyl peroxybenzoate, and t-butyl peroxy-2-ethyl hexanoate; and an azo compound such as 2,2'-azobisbutyronitrile, 2,2'-azobis(2,4-dimethylvaleronitrile), and 2,2'-azobis(4-methoxy-2,4-dimethylvaleronitrile).

In the present embodiment, from the standpoint that good curing speed can be obtained, an organic peroxide is preferable; an organic peroxide including a peroxy ester, peroxy ketal, dialkyl peroxide, or hydroperoxide skeleton is more preferable; and dicumyl peroxide, di(2-tert-butylperoxyisopropyl)benzene, 1,1,3,3-tetramethylbutyl hydroperoxide, 2,5-dimethyl-2,5-bis(tert-butylperoxy)hexyne-3, and tert-butyl hydroperoxide are still more preferable from the standpoint that suitable producibility can be obtained without deactivation during production of films or the like, besides suitable curing speed.

In the film of the present embodiment, the content of the thermal radical polymerization initiator (D) is not particularly limited, but from the standpoint that good curing speed can be obtained, the thermal radical polymerization initiator (D) is preferably contained in an amount of 0.05 parts by mass to 10 parts by mass, and more preferably contained in an amount of 0.05 parts by mass to 8 parts by mass based on 100 parts by mass in total of the propenyl group-containing resin (A) and the radical polymerizable resin or compound (B).

(Imidazole Compound (H))

The imidazole compound is not particularly limited as long as it is an imidazole compound capable of accelerating curing of the propenyl group-containing resin (A) and the radical polymerizable resin or compound (B), and publicly known imidazole compounds can be used. The imidazole compound (E) can be used as one kind, or can be used as a mixture of two or more kinds.

Examples of the imidazole compound (E) include, for example, 2-ethyl-4-methylimidazole, 2-phenyl-4-methylimidazole, 1-benzyl-2-phenylimidazole, 2,4,5-triphenylimidazole, a tertiary amine such as triethylamine and tributylamine, and a derivative thereof. Among the above, 2-ethyl-4-methylimidazole is preferable from the standpoint that curing speed is easily adjusted.

In the film of the present embodiment, the content of the imidazole compound (E) is not particularly limited, but from the standpoint that curing speed is easily adjusted, the imidazole compound (E) is preferably contained in an amount of 0.05 parts by mass to 10 parts by mass, and more preferably contained in an amount of 0.05 parts by mass to 8 parts by mass based on 100 parts by mass in total of the propenyl group-containing resin (A) and the radical polymerizable resin or compound (B).

[Thermosetting Compound (F)]

From the standpoint that curing speed is easily adjusted, it is preferable that the film of the present embodiment further contain a thermosetting compound (F) other than the propenyl group-containing resin (A) and the radical polymerizable resin or compound (B), but it is not limited thereto. The thermosetting compound (F) is not particularly limited as long as it is a compound reactive with the propenyl group-containing resin (A) and the radical polymerizable resin or compound (B), and publicly known compounds can be used. As for the thermosetting compound (F), it is preferable that is does not exhibit reactivity with the organic compound (H) having the flux function, which will be mentioned later.

The molecular weight of the thermosetting compound (F) is, not particularly limited to, preferably 400 or more from the viewpoint of preventing voids due to volatilization of the thermosetting compound (F) during flip chip bonding. On the other hand, from the viewpoint of obtaining more sufficient flux activity, the molecular weight of the thermosetting compound (F) is preferably 10,000 or less.

Such a thermosetting compound (F) is not particularly limited, but examples thereof include a compound including an alkenyl group, a compound including a (meth)acryloyl group, and a benzoxazine compound. Among the thermosetting compounds (F), a benzoxazine compound is preferably included from the standpoint that excellent flame retardancy, heat resistance, adhesiveness, and solubility in an organic solvent can be obtained. These thermosetting compounds (F) can be used as one kind, or can be used in a mixture of two or more kinds.

The compound including an alkenyl group is not particularly limited as long as it is a compound including one or more carbon-carbon double bonds in the molecule, and examples thereof include, for example, a compound including a vinyl group and a group including a (meth)allyl group.

Examples of the compound including a vinyl group include, for example, divinylbenzene, divinylnaphthalene, styrene, and a styrene derivative. These compounds including a vinyl group can be used as one kind, or can be used in a mixture of two or more kinds.

The compound including a (meth)allyl group is not particularly limited as long as it is a compound including one or more (meth)allyl groups in the molecule. Examples thereof include, for example, tri(meth)allyl cyanurate, tri(meth)allyl isocyanurate, tri(meth)allyl trimellitate, tetra(meth)allyl pyromellitate, pentaerythritol tri(meth)allyl ether, 2,2'-di(meth)allyl bisphenol A, (meth)allyl phenol novolac, and biphenylene-based (meth)allyl phenol. These compounds including a (meth)allyl group can be used as one kind, or can be used in a mixture of two or more kinds.

The compound including a (meth)acryloyl group is not particularly limited as long as it is a compound including one or more (meth)acryloyl groups in the molecule. Examples of the compound including a (meth)acryloyl group include, for example, methyl (meth)acrylate, ethyl (meth)acrylate, butyl (meth)acrylate, lauryl (meth)acrylate, polyethylene glycol (meth)acrylate, polyethylene glycol (meth)acrylate monomethylether, phenylethyl (meth)acrylate, isobornyl (meth)acrylate, cyclohexyl (meth)acrylate, benzyl (meth)acrylate, tetrahydrofurfuryl (meth)acrylate, butanediol di(meth)acrylate, hexanediol di(meth)acrylate, neopentyl glycol di(meth)acrylate, nonanediol di(meth)acrylate, glycol di(meth)acrylate, diethylene di(meth)acrylate, polyethylene glycol di(meth)acrylate, tris(meth)acryloyloxyethyl isocyanurate, polypropylene glycol di(meth)acrylate, adipic acid epoxy di(meth)acrylate, bisphenol ethyleneoxide di(meth)acrylate, hydrogenated bisphenol ethyleneoxide (meth)acrylate, bisphenol di(meth)acrylate, ε-caprolactone-modified hydroxypivalic acid neopentylglycol di(meth)acrylate, ε-caprolactone-modified dipentaerythritol hexa(meth)acrylate, ε-caprolactone-modified dipentaerythritol poly(meth)acrylate, dipentaerythritol poly(meth)acrylate, trimethylolpropane tri(meth)acrylate, triethylolpropane tri(meth)acrylate, and ethyleneoxide adducts thereof; pentaerythritol tri(meth)acrylate and ethyleneoxide adducts thereof; and pentaerythritol tetra(meth)acrylate, dipentaerythritol hexa(meth)acrylate and ethyleneoxide adducts thereof. If necessary, for example, a polymerization inhibitor such as hydroquinone and a methyl ether hydroquinone may be used as appropriate. These compounds including a (meth)acryloyl group can be used as one kind, or can be used in a mixture of two or more kinds.

The benzoxazine compound is not particularly limited as long as it has an oxazine ring as the basic skeleton. In the present embodiment, the benzoxazine compound also encompasses compounds including a polycyclic oxazine skeleton, such as naphthoxazine compounds. The benzoxazine compound does not generate a volatile by-product by heating, and the benzoxazine ring undergoes the ring opening polymerization and is suitably cured. The cured product is excellent in heat resistance, water resistance, and flame retardancy. In addition, the benzoxazine compound is expected to have high chip adhesiveness and substrate adhesiveness because a phenolic hydroxy group and a tertiary amino group, which are polar groups, are produced upon the ring opening polymerization. The benzoxazine compound can be used as one kind, or can be used as a mixture of two or more kinds.

It is preferable that the benzoxazine compound include at least one selected from the group consisting of a compound represented by the formula (12), a compound represented by the formula (13), a compound represented by the formula (14) and a compound represented by the formula (15). Note that, in the present embodiment, oligomers produced by polymerizing monomers or the like may be contained in the benzoxazine compound.

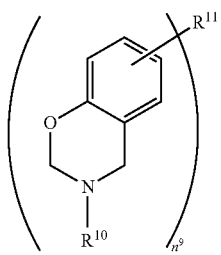

(12)

In the formula (12), each $R^{10}$ independently represents an aryl group, an aralkyl group, an alkenyl group, an alkyl group, or a cycloalkyl group. $R^{11}$ represents a hydrogen atom, an aryl group, an aralkyl group, an alkenyl group, an alkyl group, a cycloalkyl group, or a monovalent to tetravalent organic group represented by the general formulas (a) to (t). $n^9$ represents an integer of 1 to 4.

For both $R^{10}$ and $R^{11}$, the aryl group is preferably an aryl group having 6 to 18 carbon atoms. Examples of such an aryl group include a phenyl group, a naphthyl group, an indenyl group, a biphenyl group, and an anthryl group. Among them, a phenyl group is more preferable. These aryl groups have one or more, preferably one to three lower alkyl groups having 1 to 4 carbon atoms. Examples of the aryl group including such a lower alkyl group can include, for example, a tolyl group, a xylyl group, and a methylnaphthyl group.

For both $R^{10}$ and $R^{11}$, the aralkyl group is preferably a benzyl group and a phenethyl group. They have one or more, preferably one to three lower alkyl groups having 1 to 4 carbon atoms on the phenyl group thereof.

For both $R^{10}$ and $R^{11}$, examples of the alkenyl group include a vinyl group, a (meth)allyl group, a propenyl group, a butenyl group, and a hexenyl group. Among the above, a vinyl group, an allyl group, and a propenyl group are preferable, and an allyl group is more preferable.

For both $R^{10}$ and $R^{11}$, the alkyl group is preferably an alkyl group having 1 to 20 carbon atoms, more preferably an alkyl group having 1 to 10 carbon atoms. The alkyl group having 3 or more carbon atoms may be linear or branched. Examples thereof include a methyl group, an ethyl group, an n-propyl group, an isopropyl group, an n-butyl group, an isobutyl group, a sec-butyl group, a t-butyl group, an n-pentyl group, a neopentyl group, an n-hexyl group, a thexyl group, an n-heptyl group, an n-octyl group, an n-ethylhexyl group, an n-nonyl group and an n-decyl group.

For both $R^{10}$ and $R^{11}$, examples of the cycloalkyl group include a cyclopentyl group, a cyclohexyl group, and a cycloheptyl group. Preferred is a cyclohexyl group.

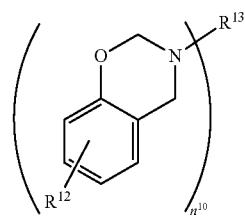

(13)

In the formula (13), each $R^{12}$ independently represents a hydrogen atom, an aryl group, an aralkyl group, an alkenyl group, an alkyl group, or a cycloalkyl group. $R^{13}$ represents an aryl group, an aralkyl group, an alkenyl group, an alkyl group, a cycloalkyl group, or a monovalent to tetravalent organic group represented by the general formulas (a) to (t). $n^{10}$ represents an integer of 1 to 4.

For both $R^{12}$ and $R^{13}$, the aryl group, the aralkyl group, the alkenyl group, the alkyl group, and the cycloalkyl group are as described above.

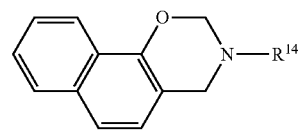

(14)

In the formula (14), $R^{14}$ represents an alkyl group, a cycloalkyl group, or a phenyl group optionally having a substituent.

The alkyl group and the cycloalkyl group in $R^{14}$ are as described above.

Examples of the phenyl group optionally having a substituent include, for example, an unsubstituted phenyl group; a monosubstituted phenyl group such as a 4-methylphenyl group, a 3-methoxyphenyl group, a 4-cyclohexylphenyl group, and a 4-methoxyphenyl group; a disubstituted phenyl group such as a 3,5-dimethylphenyl group, a 3,4-dimethylphenyl group, and a 3,5-dimethoxyphenyl group; a trisubstituted phenyl group such as a 3,4,5-trimethylphenyl group; and a 2-naphthyl group optionally having a substituent such as a 2-naphthyl group, a 3-methyl-2-naphthyl group, and a 4-methyl-2-naphthyl group.

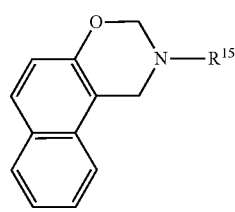

(15)

In the formula (15), $R^{15}$ represents an alkyl group, a cycloalkyl group, or a phenyl group optionally having a substituent.

The alkyl group, the cycloalkyl group, or the phenyl group optionally having a substituent in $R^{15}$ are as described above.

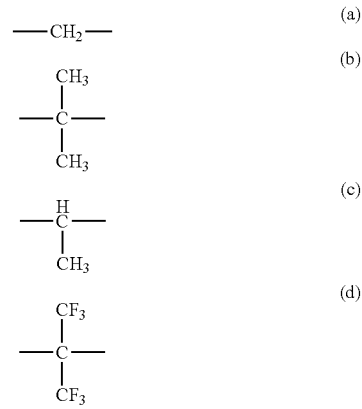

-continued (e) 

(f) 

(g) 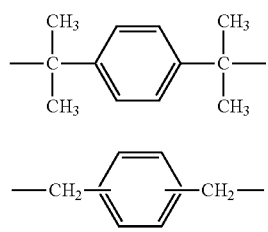

(h) 

(i) 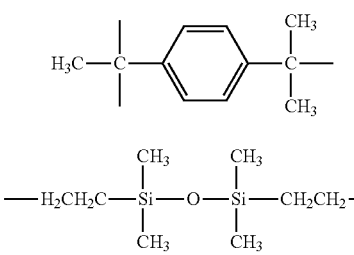

(j) 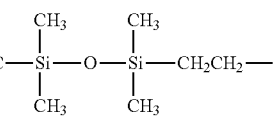

(k) 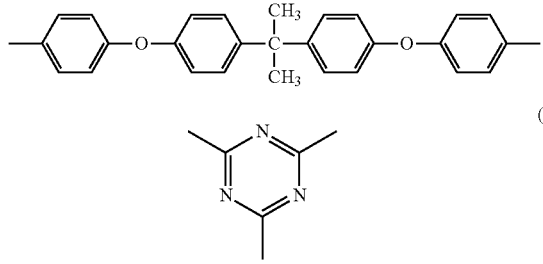

(l) 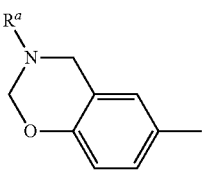

(m) 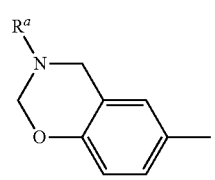

(n) 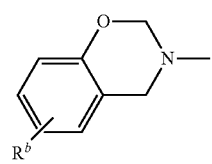

(o) 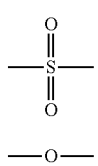

(p)

(q) 

-continued (r) 

(s) 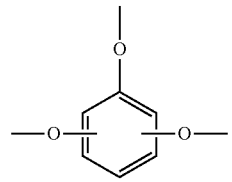

(t) 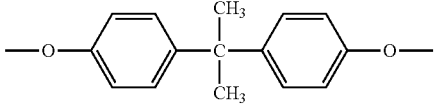

In the general formulas (a) to (t), $R^a$ represents an aryl group, an aralkyl group, an alkenyl group, an alkyl group, or a cycloalkyl group. $R^b$ represents a hydrogen atom, an aryl group, an aralkyl group, an alkenyl group, an alkyl group, or a cycloalkyl group.

For both $R^a$ and $R^b$, the aryl group, the aralkyl group, the alkenyl group, the alkyl group, and the cycloalkyl group are as described above.

From the standpoint that excellent flame retardancy and heat resistance can be obtained, it is preferable that the benzoxazine compound include at least one selected from the group consisting of a compound represented by the formula (23) and a compound represented by the formula (24) from the viewpoint of solvent solubility.

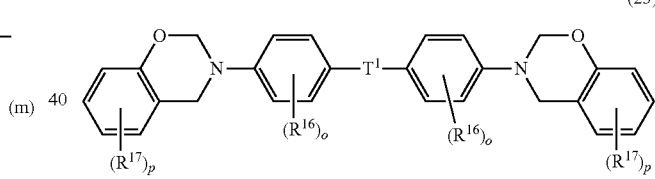
(23)

In the formula (23), each $R^{16}$ independently represents a hydrogen atom, an aryl group, an aralkyl group, an alkenyl group, an alkyl group, or a cycloalkyl group. Each o independently represents an integer of 1 to 4. Each $R^{17}$ independently represents a hydrogen atom, an aryl group, an aralkyl group, an alkenyl group, an alkyl group, or a cycloalkyl group. Each p independently represents an integer of 1 to 4. $T^1$ represents an alkylene group, a group represented by the formula (10), a group represented by the formula "—$SO_2$—", a group represented by "—CO—", an oxygen atom, or a single bond.

For both $R^{16}$ and $R^{17}$, the aryl group, the aralkyl group, the alkenyl group, the alkyl group, and the cycloalkyl group are as described above.

The alkylene group in $T^1$ is preferably a linear or branched alkylene group. Examples of the linear alkylene group include, for example, a methylene group, an ethylene group, a propylene group, a butylene group, a pentylene group, a hexylene group, a heptylene group, an octylene group, a nonylene group, a decanylene group, a trimethylene group, a tetramethylene group, a pentamethylene group, a hexamethylene group, and an octadecylene group. Examples of the branched alkylene group include, for example, alkylmethylene groups such as —C(CH$_3$)$_2$—, —CH(CH$_3$)—, —CH(CH$_2$CH$_3$)—, —C(CH$_3$)(CH$_2$CH$_3$)—, —C(CH$_3$)(CH$_2$CH$_2$CH$_3$)—, and —C(CH$_2$CH$_3$)$_2$—; and alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—.

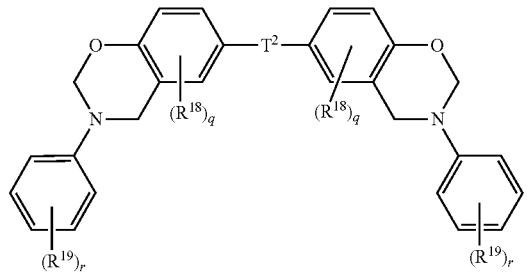

(24)

In the formula (24), each $R^{18}$ independently represents a hydrogen atom, an aryl group, an aralkyl group, an alkenyl group, an alkyl group, or a cycloalkyl group. Each q independently represents an integer of 1 to 3. Each $R^{19}$ independently represents a hydrogen atom, an aryl group, an aralkyl group, an alkenyl group, an alkyl group, or a cycloalkyl group. Each r independently represents an integer of 1 to 5. $T^2$ represents an alkylene group, a group represented by the formula (10), a group represented by the formula "—SO$_2$—", a group represented by "—CO—", an oxygen atom, or a single bond.

For both $R^{18}$ and $R^{19}$, the aryl group, aralkyl group, alkenyl group, alkyl group and cycloalkyl group are as described above. The alkylene group in $T^2$ is as described above.

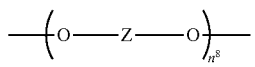

(10)

In the formula (10), Z is an alkylene group or a hydrocarbon group having 6 to 30 carbon atoms and including an aromatic ring. $n^8$ represents an integer of 0 to 5. $n^8$ is preferably an integer of 1 to 3, and more preferably 1 or 2.

The alkylene group in Z is as described above.

Examples of the hydrocarbon group having 6 to 30 carbon atoms and including an aromatic ring include, for example, a divalent groups obtained by removing two hydrogen atoms from a nucleus of a compound with aromaticity such as benzene, biphenyl, naphthalene, anthracene, fluorene, phenanthrene, indacene, terphenyl, acenaphthylene, and phenalene.

As the benzoxazine compound, those commercially available may be used, and examples thereof include, for example, P-d-based benzoxazine (manufactured by SHIKOKU CHEMICALS CORPORATION, 3,3'-(methylene-1,4-diphenylene)bis(3,4-dihydro-2H-1,3-benzoxazine), hydroxy equivalent: 217, molecular weight: 434) and F-a-based benzoxazine (manufactured by SHIKOKU CHEMICALS CORPORATION, 2,2-bis(3,4-dihydro-2H-3-phenyl-1,3-benzoxazinyl)methane, hydroxy equivalent: 217, molecular weight: 434).

These benzoxazine compounds can be used as one kind, or can be used as a mixture of two or more kinds.

When the film of the present embodiment contains the thermosetting compound (F), the content of the thermosetting compound (F) is not particularly limited, but is preferably 1 part by mass to 100 parts by mass, more preferably 5 parts by mass to 80 parts by mass, and still more preferably 10 parts by mass to 60 parts by mass based on 100 parts by mass in total of the propenyl group-containing resin (A) and the radical polymerizable resin or compound (B) from the standpoint of having good chip adhesiveness and flexibility.

[Inorganic Filler (G)]

It is preferable that the film of the present embodiment further contain an inorganic filler (G) in order to improve burning resistance, to improve thermal conductivity, and to reduce the thermal expansion coefficient. By using an inorganic filler, the burning resistance and thermal conductivity of the film and the like can be improved, and the thermal expansion coefficient can be reduced.

Although the average particle diameter of the inorganic filler (G) is not particularly limited, it is preferably 3 µm or less and more preferably 1 µm or less from the viewpoint of coping with narrower electrode pitch arranged on the chip and narrower gap between the electrodes when the film of the present embodiment is used as a pre-applied underfill material. The lower limit value of the average particle diameter is not particularly limited, but it is, for example, 10 nm. Note that, in the present embodiment, the "average particle diameter" of the inorganic filler (G) means the median diameter of the inorganic filler (G). Here, the median diameter means a certain particle diameter such that, when the particle size distribution of powder is divided into two parts based on that particle diameter, the volume of particles on the side of larger particle diameter and the volume of particles on the side of smaller particle diameter each account for 50% of the entire powder. The average particle diameter (median diameter) of the inorganic filler (G) is measured according to the wet laser diffraction scattering method.

The inorganic filler (G) is not particularly limited, but examples thereof include, for example, a silica such as natural silica, fused silica, amorphous silica, and hollow silica; an aluminum compound such as boehmite, aluminum hydroxide, alumina, and aluminum nitride; a magnesium compound such as magnesium oxide and magnesium hydroxide; a calcium compound such as calcium carbonate and calcium sulfate; a molybdenum compound such as molybdenum oxide and zinc molybdate; boron nitride; barium sulfate; a talc such as natural talc and calcined talc; mica; and glass such as short fibrous glass, spherical glass, and fine powder glass (for example, E glass, T glass, D glass). In addition, when it is desired to impart electrical conductivity or anisotropic electrical conductivity to the film of the present embodiment, metal particles of, for example, gold, silver, nickel, copper, tin alloy, and palladium may be used as the inorganic filler (G).

Among the above, from the viewpoint of improving the burning resistance and reducing the thermal expansion coefficient of the film of the present embodiment, it is preferable for the film of the present embodiment to include at least one selected from the group consisting of silica, aluminum hydroxide, alumina, boehmite, boron nitride, aluminum nitride, magnesium oxide, and magnesium hydroxide as the inorganic filler (G), and silica, alumina, and boron nitride are more preferable. Among the above, silica is still more preferable. Examples of the silica include, for example, SFP-120MC (trade name) and SFP-130MC (trade name) manufactured by Denka Company Limited; and 0.3 µm SX-CM1 (trade name), 0.3 µm SX-EM1 (trade name), 0.3

μm SV-EM1 (trade name), SC1050-MLQ (trade name), SC2050-MNU (trade name), SC2050-MTX (trade name), 2.2 μm SC6103-SQ (trade name), SE2053-SQ (trade name), Y5OSZ-AM1 (trade name), YA050C-MJE (trade name), YA050C-MJF (trade name), and YA050C-MJA (trade name) manufactured by Admatechs Company Limited.

These inorganic fillers (G) can be used alone as one kind, or can be used in an appropriate mixture of two or more kinds.

As the inorganic filler (G), those surface-treated with a silane coupling agent may be used.

The silane coupling agent is not particularly limited as long as it is a silane coupling agent generally used for the surface treatment of inorganic matters. Examples thereof include, for example, a vinylsilane-based silane coupling agent such as vinyltrimethoxysilane and γ-methacryloxypropyltrimethoxysilane; a phenylaminosilane-based silane coupling agent such as N-phenyl-3-aminopropyltrimethoxysilane; a phenylsilane-based silane coupling agent such as trimethoxyphenylsilane; and an imidazolesilane-based silane coupling agent. These silane coupling agents can be used alone as one kind, or can be used in an appropriate mixture of two or more kinds.

When the film of the present embodiment contains the inorganic filler (G), the content of the inorganic filler (G) is not particularly limited, but is preferably 500 parts by mass or less and more preferably 300 parts by mass or less based on 100 parts by mass in total of the propenyl group-containing resin (A) and the radical polymerizable resin or compound (B) from the viewpoint of ensuring the flowability of a pre-applied underfill material upon the joint while improving the burning resistance and reducing the thermal expansion coefficient of the film. In addition, the content is preferably 10 parts by mass or more, more preferably 20 parts by mass or more, and still more preferably 50 parts by mass or more.

[Organic Compound (H) Having Flux Function]

It is preferable that the film of the present embodiment further contain an organic compound (H) having a flux function in order to exhibit flux activity during the flip chip bonding. The organic compound (H) having the flux function is not particularly limited as long as it is an organic compound including one or more acid sites in the molecule. As the acid site, for example, a phosphoric acid group, a phenolic hydroxy group, a carboxyl group, and a sulfonic acid group are preferable, and a phenolic hydroxy group or a carboxyl group is more preferable from the viewpoint of more effectively preventing migration of a metal constituting the joint, such as solder and copper, and corrosion in a semiconductor device using the film of the present embodiment as a pre-applied underfill material. The organic compound (H) having the flux function can be used alone as one kind, or can be used in an appropriate mixture of two or more kinds.

In order to sufficiently remove the oxidized layer from the joint, the organic compound (H) having the flux function preferably has an acid dissociation constant pKa of, although not particularly limited, 3.8 to 15.0, and from the viewpoint of achieving both storage stability and flux activity of the varnish and the resin laminate, more preferably has an acid dissociation constant pKa of 4.0 to 14.0.

Although the organic compound (H) having the flux function in the film of the present embodiment is not particularly limited, from the viewpoint of preventing the organic compound (H) having the flux function from being volatilized before the flux activity is exhibited during the flip chip bonding, that is, from being volatilized before the oxidized layer is removed from the joint, the molecular weight thereof is preferably 200 or more, and more preferably 250 or more. In order that the organic compound (H) having the flux function has mobility as an acid and sufficient flux activity is obtained, the molecular weight thereof is preferably 8000 or less, more preferably 1000 or less, and still more preferably 500 or less.

The organic compound (H) having the flux function is not particularly limited, but examples thereof include, for example, abietic acid, neoabietic acid, dehydroabietic acid, pimaric acid, isopimaric acid, palustric acid, diphenolic acid, dihydroabietic acid, tetrahydroabietic acid, a rosin acid-modified resin such as rosin-modified maleic acid resin, N,N'-bis(salicylidene)-1,2-propanediamine, N,N'-bis(salicylidene)-1,3-propanediamine, and phenolphthalin. These organic compounds (H) having the flux function are preferable from the viewpoint of solvent solubility and storage stability.

Among the above, from the viewpoint of preventing deactivation caused by the propenyl group-containing resin (A) and the radical polymerizable resin or compound (B), dehydroabietic acid, diphenolic acid, dihydroabietic acid, tetrahydroabietic acid, a rosin acid-modified resin such as rosin-modified maleic acid resin, N,N'-bis(salicylidene)-1, 2-propanediamine, and N,N'-bis(salicylidene)-1,3-propanediamine are more preferable. Since dehydroabietic acid, dihydroabietic acid, a rosin acid-modified resin such as rosin-modified maleic acid resin, N,N'-bis(salicylidene)-1, 2-propanediamine, and N,N'-bis(salicylidene)-1,3-propanediamine have relatively low reactivity, they hardly react with the propenyl group-containing resin (A) and the radical polymerizable resin or compound (B), and are thus still more preferable from the viewpoint of maintaining sufficient flux activity necessary for removing the oxidized layer.

Those commercially available may be used as the organic compound (H) having the flux function, and examples thereof include, for example, MALKYD No. 32 (manufactured by Arakawa Chemical Industries, Ltd., (trade name), acid value: 140 or less), MALKYD No. 31 (manufactured by Arakawa Chemical Industries, Ltd., (trade name), acid value: 200 or less), and MALKYD No. 33 (manufactured by Arakawa Chemical Industries, Ltd., (trade name), acid value: 290 to 320).

When the film of the present embodiment contains the organic compound (H) having the flux function, the content of the organic compound (H) having the flux function is not particularly limited, but is preferably 5 parts by mass to 80 parts by mass, more preferably 5 parts by mass to 60 parts by mass, and still more preferably 20 parts by mass to 50 parts by mass based on 100 parts by mass in total of the propenyl group-containing resin (A) and the radical polymerizable resin or compound (B) from the viewpoint of achieving both flux activity of the film and flexibility, which is one of the important characteristics upon forming and using a laminate.

[Additional Component]

The film of the present embodiment may contain, in addition to the propenyl group-containing resin (A), the radical polymerizable resin or compound (B), the thermal radical polymerization initiator (D), the curing accelerator (C) such as the imidazole compound (E), the thermosetting compound (F), the inorganic filler (G), and the organic compound (H) having the flux function, one kind of or two or more kinds of additional components.

Examples of the additional component include, but are not particularly limited to, a flexibility imparting component. The flexibility imparting component is not particularly limited as long as it is a component that can impart flexibility to a layer containing the film, but examples thereof include, for example, a thermoplastic polymer compound such as a polyimide, a polyamide imide, a polystyrene, a polyolefin, a styrene-butadiene rubber (SBR), an isoprene rubber (IR), a butadiene rubber (BR), a (meth)acrylonitrile-butadiene rubber (NBR), a polyurethane, a polypropylene, a (meth)acrylic oligomer, a (meth)acrylic polymer, and a silicone resin, other than the propenyl group-containing resin (A), radical polymerizable resin or compound (B), the thermosetting compound (F), and the organic compound (H) having the flux function. These flexibility imparting components can be used alone as one kind, or can be used in an appropriate mixture of two or more kinds.

The film of the present embodiment can also contain a silane coupling agent as an additional component for the purposes of improving the adhesiveness of the interface between the resin and the inorganic filler, and of improving moisture absorption heat resistance. Examples of the silane coupling agent include, for example, a vinylsilane-based silane coupling agent such as vinyltrimethoxysilane and γ-methacryloxypropyltrimethoxysilane; a phenylaminosilane-based silane coupling agent such as N-phenyl-3-aminopropyltrimethoxysilane; a phenylsilane-based silane coupling agent such as trimethoxyphenylsilane; and an imidazolesilane-based silane coupling agent. These silane coupling agents can be used alone as one kind or can be used in an appropriate mixture of two or more kinds.

When the silane coupling agent is used, its content is not particularly limited, but from the viewpoints of improving moisture absorption heat resistance and of reducing the amount of volatilization at the time of the flip chip bonding, it is preferably contained in an amount of 0.05 parts by mass to 20 parts by mass based on 100 parts by mass in total of the propenyl group-containing resin (A) and the radical polymerizable resin or compound (B).

The film of the present embodiment can also contain a wetting and dispersing agent as an additional component for the purposes of improvement in the producibility of the laminate, dispersibility of the filler, and the like. The wetting and dispersing agent is not particularly limited as long as it is a wetting and dispersing agent that is used in general for a paint and the like. Examples thereof include, for example, Disperbyk (registered trademark) –110 (trade name), –111 (trade name), –180 (trade name), and –161 (trade name), BYK-W996 (trade name), –W9010 (trade name), and –W903 (trade name) manufactured by BYK Japan KK. These wetting and dispersing agents can be used alone as one kind, or can be used in an appropriate mixture of two or more kinds.

When the wetting and dispersing agent is used, its content is not particularly limited, but from the viewpoint of improving the producibility of the laminate, it is preferably contained in an amount of 0.1 parts by mass to 5 parts by mass, and is more preferably contained in an amount of 0.5 parts by mass to 3 parts by mass, based on 100 parts by mass of the inorganic filler (G). Note that, when two or more kinds of wetting and dispersing agents are used in combination, it is preferable that their total amount satisfy the ratio described above.

The film of the present embodiment may contain a variety of additive agents as additional components for various purposes in the range in which the expected characteristics are not impaired. Examples of the additive agents include, for example, an ultraviolet absorbing agent, an antioxidant, a photopolymerization initiator, a fluorescent brightening agent, a photosensitizer, a dye, a pigment, a thickening agent, a lubricant, a defoaming agent, a leveling agent, a brightening agent, a flame retardant, and an ion trapping agent. The photopolymerization initiator is not particularly limited, but examples thereof include, for example, an alkylphenone-based photopolymerization initiator; an acylphosphine oxide-based photopolymerization initiator; and a titanocene-based photopolymerization initiator. These additive agents can be used alone as one kind, or can be used in an appropriate mixture of two or more kinds.

In the film of the present embodiment, although the content of each additional additive agent is not particularly limited, it is normally 0.01 parts by mass to 10 parts by mass based on 100 parts by mass in total of the propenyl group-containing resin (A) and the radical polymerizable resin or compound (B).

[Film]

A film of the present embodiment is excellent in curability and has a low void property and excellent chip adhesiveness. In addition, a laminate containing a layer with a film excellent in a low void property and chip adhesiveness can be provided by applying the film of the present embodiment on a supporting material. When the film of the present embodiment is used as a pre-applied underfill material for the use in the form of a laminate, it is not only excellent in a low void property and chip adhesiveness, but also excellent in flux activity, joinability, and insulation reliability. As described above, the film of the present embodiment has a variety of excellent features, and in particular, it can satisfy curability, a low void property, and chip adhesiveness at a high level. Therefore, the film of the present embodiment is more useful as a pre-applied underfill material.

The film of the present embodiment is suitable for pre-applied underfill materials, and therefore, it is preferable to be in a semi-cured state (B stage). When the film is in a semi-cured state, an excellent low void property and chip adhesiveness can be obtained. In the present embodiment, the semi-cured state (B stage) refers to a state where each component contained in the film has not yet begun to actively react (cure) but the film has been heated to a dry state, that is, to a state with no tackiness so that the solvent has been volatilized. It also includes a state where the solvent has been volatilized without curing even without heating. In the present embodiment, the minimum melt viscosity in the semi-cured state (B stage) is suitable for pre-applied underfill materials, and therefore, it is normally less than 30,000 Pas. Note that in the present embodiment, the minimum melt viscosity can be measured by the method described in Examples.

The film of the present embodiment is prepared by appropriately mixing the propenyl group-containing resin (A), the radical polymerizable resin or compound (B), the thermal radical polymerization initiator (D) and the curing accelerator (C) such as the imidazole compound (E), optionally the thermosetting compound (F), the inorganic filler (G), the organic compound (H) having the flux function, and additional components. If necessary, the form of a varnish may be formed by dissolving or dispersing these components in an organic solvent, and the film of the present embodiment can be obtained by applying and drying this varnish on a supporting material. For the specific production method, reference can be made to a method for producing a laminate and Examples, which will be mentioned later. The film of the present embodiment may be peeled off from the supporting material after drying for use, or it may be used together with the supporting material.

The organic solvent is not particularly limited as long as it can suitably dissolve or disperse each of the components described above and does not impair the expected effects of the film of the present embodiment. Examples of the organic solvent include, for example, an alcohol such as methanol, ethanol, and propanol; a ketone such as acetone, methyl ethyl ketone (hereinafter, may be abbreviated as "MEK"), and methyl isobutyl ketone; an amide such as dimethylacetamide and dimethylformamide; and an aromatic hydrocarbon such as toluene and xylene. These organic solvents can be used alone as one kind, or can be used in an appropriate mixture of two or more kinds.

As the supporting material, those publicly known can be used and there is no particular limitation thereon, but it is preferably a resin film. As the supporting material, there is no particular limitation, but a resin film can be used. Examples of the material of the resin film include, for example, a film including at least one or more resins selected from the group consisting of a polyvinyl chloride, a polyvinylidene chloride, a polybutene, a polybutadiene, a polyurethane, an ethylene-vinyl acetate copolymer, a polyester such as a polyethylene terephthalate, a polyethylene naphthalate and a polybutylene terephthalate, a polyethylene, a polypropylene, an ethylene-propylene copolymer, a polymethylpentene, a polyimide, and a polyamide; and a mold releasing film formed by coating the surface of these films with a mold releasing agent. Among the above, a polyester, a polyimide, and a polyamide are preferable, and a polyethylene terephthalate, which is one kind of polyester, is more preferable.

The thickness of the film of the present embodiment is not particularly limited, but from the standpoint of ensuring a filling property of the underfill material between connection terminals at the time of mounting, it is preferably 10 μm to 100 μm, and is more preferably 10 μm to 50 μm.

[Laminate]

A laminate of the present embodiment contains: a supporting material; and a layer including the film of the present embodiment laminated on the supporting material. Such a laminate can be obtained by attaching the film of the present embodiment to the supporting material.

Although the thickness of the supporting material is not particularly limited, it is preferably 10 μm to 100 μm from the standpoints of producibility of the laminate, for example, stability of the coating thickness in the case of coating the supporting material with the film, and of conveyance properties of the laminate. The lower limit of the thickness of the supporting material is more preferably 12 μm or more, still more preferably 25 μm or more, and yet even more preferably 30 μm or more from the standpoint of ensuring the yield upon producing the laminate. The upper limit of the thickness of the supporting substrate is more preferably 80 μm or less and is still more preferably 50 μm or less from the standpoint that the supporting material is peeled in the middle of the process and is not present in the end as a constituent member of the semiconductor device and from the standpoint of production costs of the laminate.

The method for producing the laminate of the present embodiment by forming a layer containing the film of the present embodiment (hereinafter, also simply referred to as a "film layer") on the supporting material is not particularly limited. Examples of such a production method include, for example, an approach in which the surface of the supporting material is coated with a varnish formed by dissolving or dispersing the film of the present embodiment in an organic solvent, and dried under heating and/or reduced pressure, and the solvent is removed to solidify the film of the present embodiment, thereby forming the film layer. The drying conditions are not particularly limited, but the drying is carried out such that the content ratio of the organic solvent to the film layer is normally 10 parts by mass or less, and preferably 5 parts by mass or less based on the total amount of the film layer (100 parts by mass). Conditions for achieving such drying vary depending on the type of the organic solvent in the varnish and the amount to be compounded. For example, in the case of a varnish containing 10 parts by mass to 300 parts by mass of methyl ethyl ketone based on 100 parts by mass in total of the propenyl group-containing resin (A) and the radical polymerizable resin or compound (B) including a maleimide group, the standard drying time is about 2 minutes to 10 minutes under the heating conditions of 90° C. to 160° C. at 1 atm. Note that the film layer described above can function as an insulating layer.

[Semiconductor Wafer with Film Layer and Substrate for Mounting Semiconductor with Film Layer]

A semiconductor wafer with a film layer of the present embodiment contains: a semiconductor wafer; and the laminate of the present embodiment laminated on the semiconductor wafer, wherein the layer containing the film is laminated on the semiconductor wafer. Also, a substrate for mounting a semiconductor with a film layer of the present embodiment contains: a substrate for mounting the semiconductor; and the laminate of the present embodiment laminated on the substrate for mounting the semiconductor, wherein the layer containing the film is laminated on the substrate for mounting the semiconductor.

The method for fabricating the semiconductor wafer with a film layer of the present embodiment is not particularly limited, but for example, it is obtained by pasting the semiconductor wafer and the film layer together such that the film layer of the laminate of the present embodiment and the surface of the semiconductor wafer on which the electrodes have been formed, that is, the surface on which the joint with the substrate will take place, face each other. In addition, the method for fabricating the substrate for mounting the semiconductor with a film layer of the present embodiment is not particularly limited, but for example, it is obtained by pasting the substrate for mounting the semiconductor and the film layer together such that the film layer of the laminate of the present embodiment and the surface of the substrate for mounting the semiconductor on which a chip is mounted face each other.

Although the method for pasting the laminate of the present embodiment and the semiconductor wafer or substrate for mounting the semiconductor together is not particularly limited, a vacuum pressing laminator can be suitably used. In this case, a method is preferable in which pressure is applied to the laminate of the present embodiment via an elastic body such as rubber, thereby pasting the laminate and the semiconductor wafer or substrate for mounting the semiconductor together. The lamination conditions are not particularly limited as long as they are conditions generally used in the art, and for example, the lamination is performed at a temperature of 50° C. to 140° C., with a contact pressure in the range of 1 kgf/cm$^2$ to 11 kgf/cm$^2$, and under an atmospheric reduced pressure of 20 hPa or less. Subsequently to the lamination step, smoothing of the pasted laminate may be performed through hot pressing with metal plates. The lamination step and the smoothing step can be performed sequentially with a commercially available vacuum pressing laminator. In the laminate stuck to the semiconductor wafer or substrate for mounting the semiconductor, removal of the supporting material is performed before the flip chip bonding of the chip in any case.

[Semiconductor Device]

A semiconductor device of the present embodiment contains the semiconductor wafer with a film layer of the present embodiment and/or the substrate for mounting a semiconductor with a film layer of the present embodiment. Although the method for producing the semiconductor device of the present embodiment is not particularly limited, examples thereof include, for example, an approach in which the semiconductor wafer with a film layer of the present embodiment is thinned with a grinding means or the like, and is divided into individual pieces with a dicing saw or the like to make the chip with the film layer, which are then mounted on the substrate for mounting the semiconductor. In addition, the chip may be mounted on the substrate for mounting the semiconductor with a film layer of the present embodiment. In the method for mounting the chip with the film layer on the substrate for mounting the semiconductor and the method for mounting the semiconductor chip on the substrate for mounting the semiconductor with the film layer, a flip chip bonder compatible with the thermocompression bonding method can be suitably used. In addition, although the case in which the chip is mounted on the substrate for mounting the semiconductor in the form of flip chip bonding is described for convenience in the present embodiment, the object to which the film of the present embodiment is applied while mounting the chip in the form of flip chip bonding does not need to be a substrate for mounting the semiconductor. For example, the film of the present embodiment may be used for a joint between a semiconductor wafer and a chip upon mounting the chip on the semiconductor wafer or for a joint between the chip of a chip laminate in which inter-chip connection is formed via TSV (Through Silicon Via) or the like, and in any case, the superiority according to the present invention can be obtained.

EXAMPLES

The present embodiment will be more specifically described below using Examples and Comparative Examples. The present embodiment is not limited in any way by the following Examples.

[Fabrication of Film and Laminate]

Example 1

As a propenyl group-containing resin (A), 60 parts by mass (30 parts by mass in terms of non-volatile portions) of a methyl ethyl ketone (MEK) solution (non-volatile portions 50%) of the propenyl group-containing resin represented by the formula (25) (BPN01-S (trade name), manufactured by Gun Ei Chemical Industry Co., Ltd., mass average molecular weight: 1830); as a radical polymerizable resin or compound (B), 33 parts by mass of the maleimide compound represented by the formula (5) (BMI-1000P (trade name), manufactured by K·I Chemical Industry Co., LTD.), 14 parts by mass (7 parts by mass in terms of non-volatile portions) of a methyl ethyl ketone (MEK) solution (non-volatile portions 50% by mass) of bis-(3-ethyl-5-methyl-4-maleimidophenyl)methane (BMI-70 (trade name), manufactured by K·I Chemical Industry Co., LTD.), 14 parts by mass (7 parts by mass in terms of non-volatile portions) of a MEK solution (non-volatile portions 50% by mass) of 2,2-bis(4-(4-maleimidophenoxy)phenyl)propane (BMI-80 (trade name), manufactured by K·I Chemical Industry Co., LTD.), and 77 parts by mass (23 parts by mass in terms of non-volatile portions) of the maleimide compound represented by the formula (7) (MIR-3000-70MT (trade name), manufactured by Nippon Kayaku Co., Ltd., non-volatile portions 30% by mass); as a thermosetting compound (F), 66 parts by mass (33 parts by mass in terms of non-volatile portions) of a MEK solution (non-volatile portions 50% by mass) of P-d-based benzoxazine (manufactured by SHIKOKU CHEMICALS CORPORATION (trade name), 3,3'-(methylene-1,4-diphenylene)bis(3,4-dihydro-2H-1,3-benzoxazine), hydroxy equivalent: 217, molecular weight: 434); as an organic compound (H) having a flux function, 54 parts by mass (27 parts by mass in terms of non-volatile portions) of a MEK solution (non-volatile portions 50% by mass) of a rosin-modified maleic acid resin (MALKYD No. 32 (trade name), manufactured by Arakawa Chemical Industries, Ltd.); as an inorganic filler (G), 266 parts by mass (133 parts by mass in terms of non-volatile portions) of a MEK solution of slurry silica (YA050C-MJE (trade name), solid content 50% by mass, average particle diameter: 50 nm, manufactured by Admatechs Company Limited); as thermal radical polymerization initiator (D), 1 part by mass of bis(1-methyl-1-phenylethyl)peroxide (dicumyl peroxide, manufactured by KISHIDA CHEMICAL Co., Ltd., 10 hour half-life period temperature: 116.4° C.); and as an imidazole compound (E), 4 parts by mass of 2-ethyl-4-methylimidazole (2E4MZ, manufactured by SHIKOKU CHEMICALS CORPORATION) were mixed, and the mixture was stirred for 40 minutes by using a high speed stirring apparatus, thereby obtaining a varnish (MEK amount: 264 parts by mass). Note that, the ratio (propenyl group:polymerizable functional group) between propenyl groups in the propenyl group-containing resin (A) (eq./100 g-resin) and polymerizable functional groups (maleimide groups) in the radical polymerizable resin or compound (B) (eq./100 g-resin) was 1:2. With this varnish, a polyethylene terephthalate film having a thickness of 38 μm (TR1-38 (trade name), manufactured by UNITIKA LTD.), the surface of which was coated with a mold releasing agent, was coated, and it was heated and dried at 100° C. for 5 minutes, thereby obtaining a laminate with the film layer which was obtained from the varnish and had a thickness of 30 μm. Note that, the film layer was in the semi-cured state (B-staged).

Example 2

A varnish was prepared in the same manner as Example 1, except that 42 parts by mass (21 parts by mass in terms of non-volatile portions) of a MEK solution (non-volatile portions 50%) of the propenyl group-containing resin represented by the formula (26) (TPMPO1 (trade name), manufactured by Gun Ei Chemical Industry Co., Ltd., mass average molecular weight: 2371) was compounded as the propenyl group-containing resin (A) instead of 60 parts by mass (30 parts by mass in terms of non-volatile portions) of the propenyl group-containing resin represented by the formula (25) (BPN01-S (trade name)), and, as the radical polymerizable resin or compound (B), 77 parts by mass (23 parts by mass in terms of non-volatile portions) of the maleimide compound represented by the formula (7) (MIR-3000-70MT (trade name)) was changed to 107 parts by mass (32 parts by mass in terms of non-volatile portions). Note that, the ratio (propenyl group:polymerizable functional group) between propenyl groups in the propenyl group-containing resin (A) (eq./100 g-resin) and polymerizable functional groups (maleimide groups) in the radical polymerizable resin or compound (B) (eq./100 g-resin) was 1:2. Using this varnish, a laminate with the film layer which was obtained from the varnish and had a thickness of 30 μm was obtained in the same manner as Example 1. Note that, the film layer was in the semi-cured state (B-staged).

Example 3

A varnish was prepared in the same manner as in Example 1, except that as the propenyl group-containing resin (A), 60 parts by mass (30 parts by mass in terms of non-volatile portions) of the propenyl group-containing resin represented by the formula (25) (BPN01-S (trade name)) was changed to 22 parts by mass (11 parts by mass in terms of non-volatile portions); as the radical polymerizable resin or compound (B), 33 parts by mass of the maleimide compound represented by the formula (5) (BMI-1000P (trade name)) was changed to 47 parts by mass, and 77 parts by mass (23 parts by mass in terms of non-volatile portions) of the maleimide compound represented by the formula (7) (MIR-3000-70MT (trade name)) was changed to 93 parts by mass (28 parts by mass in terms of non-volatile portions); and as the organic compound (H) having the flux function, 54 parts by mass (27 parts by mass in terms of non-volatile portions) of the rosin-modified maleic acid resin (MALKYD No. 32 (trade name)) was changed to 80 parts by mass (40 parts by mass in terms of non-volatile portions). Note that, the ratio (propenyl group:polymerizable functional group) between propenyl groups in the propenyl group-containing resin (A) (eq./100 g-resin) and polymerizable functional groups (maleimide groups) in the radical polymerizable resin or compound (B) (eq./100 g-resin) was 1:7. Using this varnish, a laminate with the film layer which was obtained from the varnish and had a thickness of 30 μm was obtained in the same manner as Example 1. Note that, the film layer was in the semi-cured state (B-staged).

Example 4

A varnish was prepared in the same manner as Example 1, except that as the radical polymerizable resin or compound (B), the maleimide compound represented by the formula (7) (MIR-3000-70MT (trade name)) was not compounded, 7 parts by mass (14 parts by mass in terms of non-volatile portions) of the maleimide compound (bis-(3-ethyl-5-methyl-4-maleimidephenyl)methane (BMI-70 (trade name)) was changed to 36 parts by mass (18 parts by mass in terms of non-volatile portions), and 7 parts by mass (14 parts by mass in terms of non-volatile portions) of the maleimide compound (2,2-bis(4-(4-maleimidephenoxy)phenyl)propane, BMI-80 (trade name)) was changed to 38 parts by mass (19 parts by mass in terms of non-volatile portions). Note that, the ratio (propenyl group:polymerizable functional group) between propenyl groups in the propenyl group-containing resin (A) (eq./100 g-resin) and polymerizable functional groups (maleimide groups) in the radical polymerizable resin or compound (B) (eq./100 g-resin) was 1:2. Using this varnish, a laminate with the film layer which was obtained from the varnish and had a thickness of 30 μm was obtained in the same manner as Example 1. Note that, the film layer was in the semi-cured state (B-staged).

Example 5

A varnish was prepared in the same manner as Example 1, except that as the radical polymerizable resin or compound (B), 77 parts by mass (23 parts by mass in terms of non-volatile portions) of the maleimide compound represented by the formula (4) (BMI-2300 (trade name), manufactured by Daiwa Kasei Industry Co., LTD.) was compounded instead of 77 parts by mass (23 parts by mass in terms of non-volatile portions) of the maleimide compound represented by the formula (7) (MIR-3000-70MT (trade name)). Note that, the ratio (propenyl group:polymerizable functional group) between propenyl groups in the propenyl group-containing resin (A) (eq./100 g-resin) and polymerizable functional groups (maleimide groups) in the radical polymerizable resin or compound (B) (eq./100 g-resin) was 1:2. Using this varnish, a laminate with the film layer which was obtained from the varnish and had a thickness of 30 μm was obtained in the same manner as Example 1. Note that, the film layer was in the semi-cured state (B-staged).

Comparative Example 1

A varnish was prepared in the same manner as Example 1, except that 77 parts by mass (23 parts by mass in terms of non-volatile portions) of the maleimide compound represented by the formula (7) (MIR-3000-70MT (trade name)) was changed to 177 parts by mass (53 parts by mass in terms of non-volatile portions), and the propenyl group-containing resin represented by the formula (25) (BPN01-S (trade name)) was not used. Using this varnish, a laminate with the film layer which was obtained from the varnish and had a thickness of 30 μm was obtained in the same manner as Example 1.

Comparative Example 2

A varnish was prepared in the same manner as Example 1, except that 36 parts by mass (18 parts by mass in terms of non-volatile portions) of a MEK solution (non-volatile portions 50%) of the vinyl group-containing resin represented by formula (27) (LVA01 (trade name), manufactured by Gun Ei Chemical Industry Co., Ltd.) was compounded instead of 60 parts by mass (30 parts by mass in terms of non-volatile portions) of the propenyl group-containing resin represented by the formula (25) (BPN01-S (trade name)), and 77 parts by mass (23 parts by mass in terms of non-volatile portions) of the maleimide compound represented by the formula (7) (MIR-3000-70MT (trade name)) was changed to 117 parts by mass (35 parts by mass in terms of non-volatile portions). Using this varnish, a laminate with the film layer which was obtained from the varnish and had a thickness of 30 μm was obtained in the same manner as Example 1.

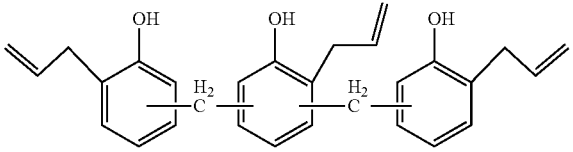

(27)

Using this varnish, a laminate with the film layer which was obtained from the varnish and had a thickness of 30 μm was obtained in the same manner as Example 1.

[Evaluation of Laminates]
(1) Curability

The film layer obtained from the varnishes in the laminates obtained in Examples 1 to 5 and Comparative Examples 1 and 2 was crushed to obtain resin powder. The calorific value of the obtained resin powder in the range of 30° C. to 350° C. was measured using a differential scanning calorimeter (Q100 (trade name), manufactured by TA Instruments). The curability was evaluated as follows: the case where the calorific value (W/g) at 120° C. was 0.01 W/g or more was marked as A, the case where it was 0.006 W/g or more and less than 0.01 W/g was marked as B, and the case where it was less than 0.006 W/g was marked as C. When the calorific value is 0.01 W/g or more, a film with an excellent filling property in semiconductor chip bonding using a flip chip bonder can be obtained. The results are shown in Table 1.

(2) Voids

The laminates obtained in Examples 1 to 5 and Comparative Examples 1 and 2 were cut into 8 mm×8 mm squares, and the film layer obtained from the varnishes in the laminates after being cut was stacked on a substrate for evaluation, followed by lamination. Thereafter, the polyethylene terephthalate films in the laminates were peeled. Thereafter, by using a flip chip bonder (LFB-2301 (trade name), manufactured by SHINKAWA LTD.), the peeling surface of the film layer was bonded, by thermocompression, onto semiconductor chips having a Cu pillar constituted with copper and solder as an electrode under conditions with a stage temperature of 70° C., a bond head temperature of 260° C., a load of 50 N, and a time of 6 seconds, thereby performing bonding. For the samples (semiconductor chips/film layer/substrate for evaluation) after the bonding, the presence or absence of voids in the film layer within the range of the semiconductor chip bonding area was confirmed using an ultrasonic precise flaw detection image processing device (μ-SDS (trade name), manufactured by KJTD Co., Ltd.). Evaluation was made as follows: the case where the proportion of voids was less than 10% was marked as A, the case where it was 10% or more and less than 30% was marked as B, and the case where it was 30% or more was marked as C. When the proportion of voids is less than 10%, a laminate with high insulation reliability can be obtained. The results are shown in Table 1.

(3) Chip Adhesiveness

The laminates obtained in Examples 1 to 5 and Comparative Examples 1 and 2 were cut into a 8 mm×8 mm square, and the film layer obtained from the varnishes in the laminates after being cut was laminated on a face of a substrate for evaluation, followed by lamination. Thereafter, the polyethylene terephthalate films in the laminates were peeled. Thereafter, by using a flip chip bonder (LFB-2301 (trade name), manufactured by SHINKAWA LTD.), the peeling surface of the film layer was bonded, by thermocompression, onto semiconductor chips having a Cu pillar constituted with copper and solder as an electrode under conditions with a stage temperature of 70° C., a bond head temperature of 260° C., a load of 50 N, and a time of 6 seconds, thereby performing bonding. The cross section of the central part of the sample (semiconductor chips/film layer/substrate for evaluation) after the bonding was cut out, and peeling at the interface between the semiconductor chips and the film layer was confirmed in the cross-section using a scanning electron microscope (JCM-6000Plus (trade name) manufactured by JEOL Ltd.). Evaluation was made as follows: the case where the proportion of peeling was less than 1% was marked as A, the case where it was 1% or more and less than 20% was marked as B, and the case where it was 20% or more was marked as C. When the proportion of peeling is less than 1%, a laminate with high insulation reliability can be obtained. The results are shown in Table 1. Note that, in Table 1, the case where chip adhesiveness could not be measured, since many voids are present at the time of semiconductor bonding and the areas in which the film layer was present near the semiconductor chips was small, was marked as "-."

(4) Minimum Melt Viscosity 1 g of the resin powder obtained by crushing the film layer obtained from the varnishes in the laminates obtained in Examples 1 to 5 and Comparative Examples 1 and 2 was weighed and molded into a tablet form with a diameter of 25 mm and a thickness of 1.5 mm using a tablet press (SSP-10A (trade name), manufactured by Shimadzu Corporation) under conditions with a pressure of 20 kN and a time of 5 minutes. Using a rheometer (ARES-G2 (trade name), manufactured by TA Instruments), the viscosity in the range of 40° C. to 260° C. was measured under conditions with a temperature increase rate of 10° C./min. The case where the minimum melt viscosity was 10,000 Pa·s or more and less than 30,000 Pa·s was marked by A, and the case where the minimum melt viscosity was 30,000 Pa·s or more or less than 10,000 Pa·s was marked by B. The results are shown in Table 1.

TABLE 1

| Evaluation | Example 1 | Example 2 | Example 3 | Example 4 | Example 5 | Comparative Example 1 | Comparative Example 2 |
|---|---|---|---|---|---|---|---|
| Curability | A | A | A | A | A | B | C |
| Voids | A | A | A | B | B | B | C |
| Chip adhesiveness | A | A | B | A | B | C | — |
| Minimum melt viscosity | A | A | A | A | B | B | B |

The present application is based on Japanese Patent Application No. 2019-122429 filed on Jun. 28, 2019, the contents of which are incorporated herein by reference.

INDUSTRIAL APPLICABILITY

The film of the present embodiment exhibits various effects such as excellent curability, a low void property, and chip adhesiveness, and is thus suitable as a pre-applied underfill material. In addition, since the film of the present embodiment is also excellent in flux activity, it can impart high reliability that can withstand use for a long period of time in laminates obtained through the joint between a chip and substrate, the joint between a chip and semiconductor wafer, and the joint between a chip and a chip.

The invention claimed is:

1. A film comprising:
a propenyl group-containing resin (A) comprising, at an end of a molecule, a constituent unit represented by the following formula (1);
a radical polymerizable resin or compound (B) other than the propenyl group-containing resin (A);

a curing accelerator (C), and
an inorganic filler (G), wherein
the radical polymerizable resin or compound (B) comprises at least one selected from the group consisting of a maleimide group and a citraconimide group:

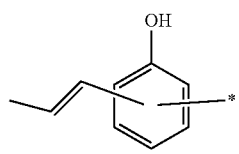
(1)

wherein—* represents a bonding hand.

2. The film according to claim 1, wherein the propenyl group-containing resin (A) has a mass average molecular weight of 300 to 10,000.

3. The film according to claim 1, wherein the propenyl group-containing resin (A) comprises a resin represented by the following formula (2):

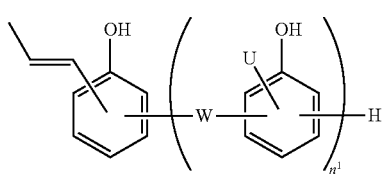
(2)

wherein each W independently represents a hydrocarbon group having 6 to 15 carbon atoms and optionally having a substituent; each U independently represents a hydrogen atom or an alkenyl group having 2 to 6 carbon atoms; and $n^1$ represents the number of repetitions, and its average value is a real number of 1 to 20.

4. The film according to claim 1, wherein the propenyl group-containing resin (A) comprises a resin represented by the following formula (3):

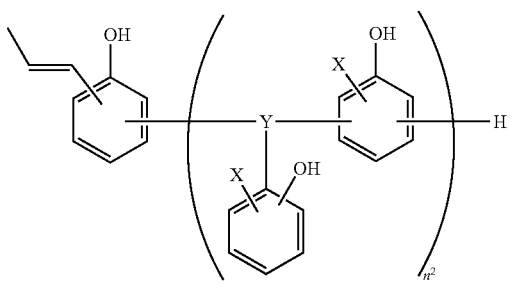
(3)

wherein each Y independently represents a hydrocarbon group having 1 to 6 carbon atoms; each X independently represents a hydrogen atom or an alkenyl group having 2 to 6 carbon atoms; and $n^2$ represents the number of repetitions, and its average value is a real number of 1 to 20.

5. The film according to claim 1, wherein the radical polymerizable resin or compound (B) comprises at least one selected from the group consisting of 2,2-bis[4-(4-maleimidophenoxy)phenyl]propane, a maleimide compound represented by the following formula (4), a maleimide compound represented by the following formula (5), a maleimide compound represented by the following formula (6), a maleimide compound represented by the following formula (7), a maleimide compound represented by the following formula (8), and a maleimide compound represented by the following formula (9):

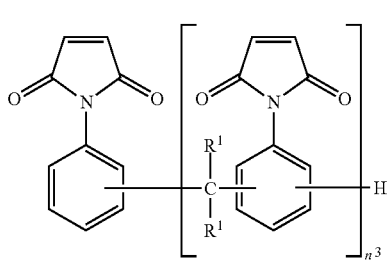
(4)

wherein each $R^1$ independently represents a hydrogen atom or a methyl group, and $n^3$ represents an integer of 1 to 10;

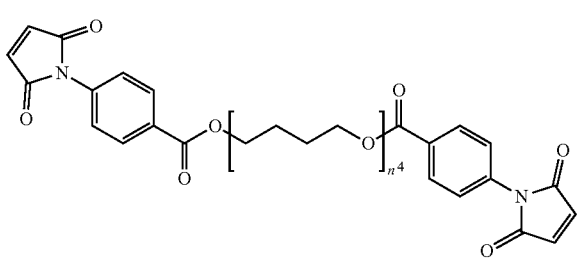
(5)

wherein $n^4$ represents an integer of 1 to 30;

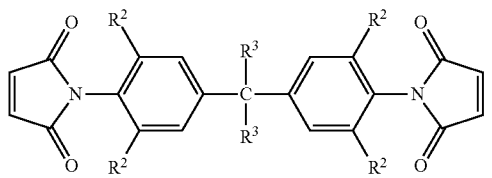
(6)

wherein each $R^2$ independently represents a hydrogen atom, a methyl group, or an ethyl group, and each $R^3$ independently represents a hydrogen atom or a methyl group;

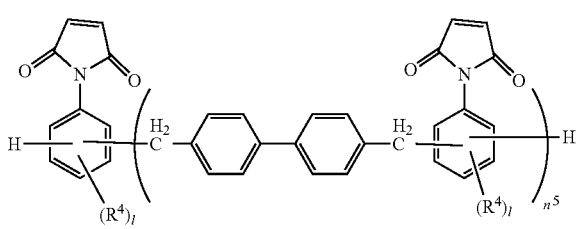
(7)

wherein each $R^4$ independently represents a hydrogen atom, an alkyl group having 1 to 5 carbon atoms, or a phenyl group, each 1 independently represents an integer of 1 to 3, and $n^5$ represents an integer of 1 to 10;

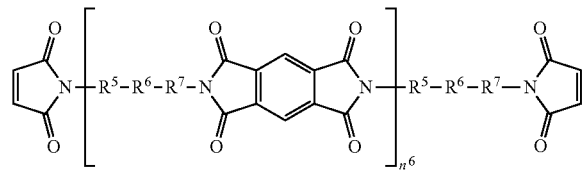
(8)

wherein $R^5$ and $R^7$ each independently represent a hydrocarbon group in which 8 or more atoms are linearly linked, each $R^6$ independently represents a substituted or unsubstituted cyclic hydrocarbon group optionally having a heteroatom in which 4 to 10 atoms constitute the ring, and $n^6$ represents an integer of 1 to 10;

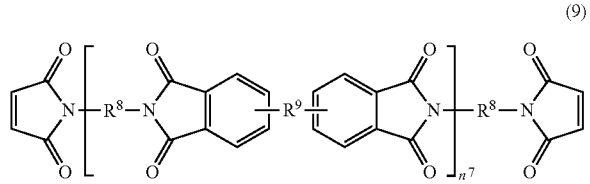
(9)

wherein each $R^8$ independently represents an alkylene group, each $R^9$ independently represents an alkylene group, a group represented by the following formula (10), a group represented by the formula "—$SO_2$—", a group represented by "—CO—", a group represented by the following formula (11), an oxygen atom, or a single bond, and $n^7$ represents an integer of 1 to 10; and

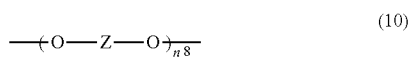
(10)

wherein Z is an alkylene group or a hydrocarbon group having 6 to 30 carbon atoms and comprising an aromatic ring, and $n^8$ represents an integer of 0 to 5.

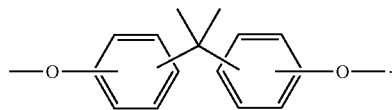
(11)

6. The film according to claim 1, wherein a ratio between propenyl groups in the propenyl group-containing resin (A) and polymerizable functional groups in the radical polymerizable resin or compound (B) (propenyl group:polymerizable functional group) is 1:1 to 1:7.

7. The film according to claim 1, wherein the curing accelerator (C) comprises at least one selected from the group consisting of a thermal radical polymerization initiator (D) and an imidazole compound (E).

8. The film according to claim 7, wherein the thermal radical polymerization initiator (D) has a 10 hour half-life period temperature of 100° C. or higher.

9. The film according to claim 7, wherein the thermal radical polymerization initiator (D) comprises an organic peroxide.

10. The film according to claim 7, wherein the thermal radical polymerization initiator (D) has a peroxy ester, a peroxy ketal, a dialkyl peroxide, or a hydroperoxide skeleton.

11. The film according to claim 7, wherein the thermal radical polymerization initiator (D) comprises at least one selected from the group consisting of dicumyl peroxide, di(2-tert-butylperoxyisopropyl)benzene, 1,1,3,3-tetramethylbutyl hydroperoxide, 2,5-dimethyl-2,5-bis(tert-butylperoxy)hexyne-3, and tert-butyl hydroperoxide.

12. The film according to claim 1, wherein a content of the curing accelerator (C) is 0.05 parts by mass to 10 parts by mass based on 100 parts by mass in total of the propenyl group-containing resin (A) and the radical polymerizable resin or compound (B).

13. The film according to claim 1, further comprising a thermosetting compound (F) other than the propenyl group-containing resin (A) and the radical polymerizable resin or compound (B).

14. The film according to claim 13, wherein the thermosetting compound (F) has a molecular weight of 400 or more.

15. The film according to claim 13, wherein the thermosetting compound (F) comprises a benzoxazine compound.

16. The film according to claim 15, wherein the benzoxazine compound comprises at least one selected from the group consisting of a compound represented by the following formula (12), a compound represented by the following formula (13), a compound represented by the following formula (14) and a compound represented by the following formula (15):

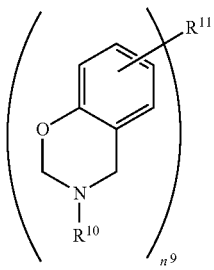
(12)

wherein each $R^{10}$ independently represents an aryl group, an aralkyl group, an alkenyl group, an alkyl group, or a cycloalkyl group, $R^{11}$ represents a hydrogen atom, an aryl group, an aralkyl group, an alkenyl group, an alkyl group, a cycloalkyl group, or a monovalent to tetravalent organic group represented by the following general formulas (a) to (t), and $n^9$ represents an integer of 1 to 4;

(13)

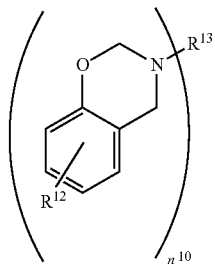

wherein each R$^{12}$ independently represents a hydrogen atom, an aryl group, an aralkyl group, an alkenyl group, an alkyl group, or a cycloalkyl group, R$^{13}$ represents an aryl group, an aralkyl group, an alkenyl group, an alkyl group, a cycloalkyl group, or a monovalent to tetravalent organic group represented by the following general formulas (a) to (t), and n$^{10}$ represents an integer of 1 to 4;

(14)

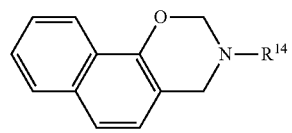

wherein R$^{14}$ represents an alkyl group, a cycloalkyl group, or a phenyl group optionally having a substituent;

(15)

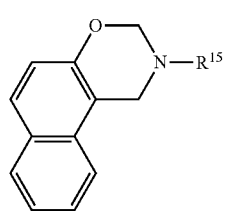

wherein R$^{15}$ represents an alkyl group, a cycloalkyl group, or a phenyl group optionally having a substituent; and (a)

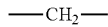

(b)

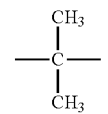

(c)

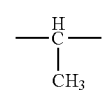

(d)

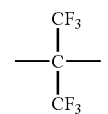

(e)

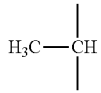

(f)

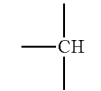

(g)

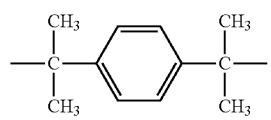

(h)

(i)

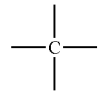

(j)

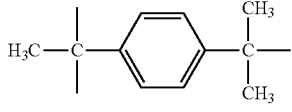

(k)

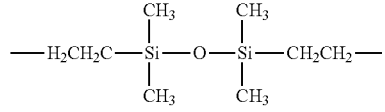

(l)

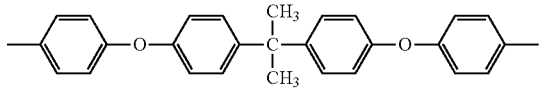

(m)

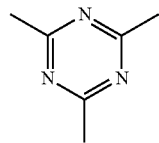

(n)

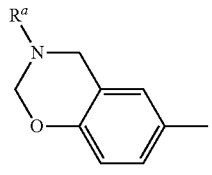

(o)

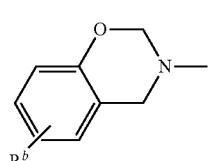

(p)

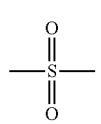

(q)

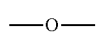

-continued

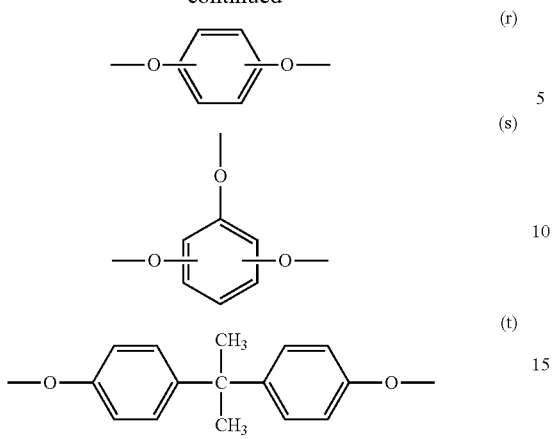

wherein $R^a$ represents an aryl group, an aralkyl group, an alkenyl group, an alkyl group, or a cycloalkyl group, and $R^b$ represents a hydrogen atom, an aryl group, an aralkyl group, an alkenyl group, an alkyl group, or a cycloalkyl group.

17. The film according to claim 15, wherein the benzoxazine compound comprises at least one selected from the group consisting of a compound represented by the following formula (23) and a compound represented by the following formula (24):

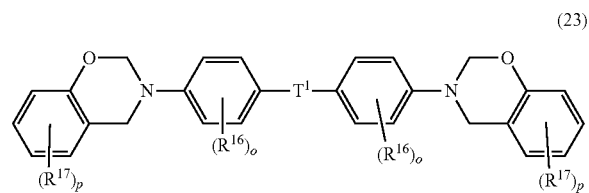

wherein each $R^{16}$ independently represents a hydrogen atom, an aryl group, an aralkyl group, an alkenyl group, an alkyl group, or a cycloalkyl group, each o independently represents an integer of 1 to 4, each $R^{17}$ independently represents a hydrogen atom, an aryl group, an aralkyl group, an alkenyl group, an alkyl group, or a cycloalkyl group, each p independently represents an integer of 1 to 4, and $T^1$ represents an alkylene group, a group represented by the following formula (10), a group represented by the formula "—$SO_2$—", a group represented by "—CO—", an oxygen atom, or a single bond;

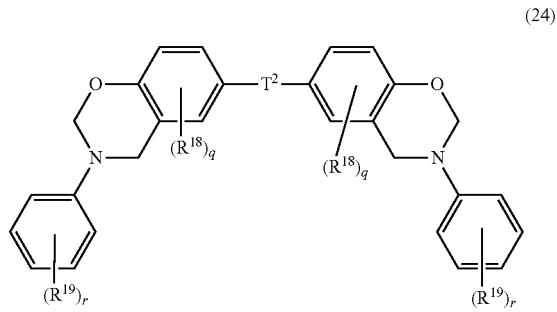

wherein each $R^{18}$ independently represents a hydrogen atom, an aryl group, an aralkyl group, an alkenyl group, an alkyl group, or a cycloalkyl group, each q independently represents an integer of 1 to 3, each $R^{19}$ independently represents a hydrogen atom, an aryl group, an aralkyl group, an alkenyl group, an alkyl group, or a cycloalkyl group, each r independently represents an integer of 1 to 5, and $T^2$ represents an alkylene group, a group represented by the following formula (10), a group represented by the formula "—$SO_2$—", a group represented by "—CO—", an oxygen atom, or a single bond; and

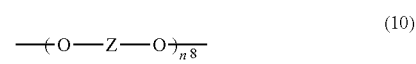

wherein Z is an alkylene group or a hydrocarbon group having 6 to 30 carbon atoms and comprising an aromatic ring, and $n^8$ represents an integer of 0 to 5.

18. The film according to claim 13, wherein a content of the thermosetting compound (F) is 1 part by mass to 100 parts by mass based on 100 parts by mass in total of the propenyl group-containing resin (A) and the radical polymerizable resin or compound (B).

19. The film according to claim 1, wherein the inorganic filler (G) has an average particle diameter of 3 μm or less.

20. The film according to claim 1, wherein the inorganic filler (G) comprises at least one selected from the group consisting of silica, aluminum hydroxide, alumina, boehmite, boron nitride, aluminum nitride, magnesium oxide, and magnesium hydroxide.

21. The film according to claim 1, wherein the inorganic filler (G) is silica.

22. The film according to claim 1, wherein a content of the inorganic filler (G) is 500 parts by mass or less based on 100 parts by mass in total of the propenyl group-containing resin (A) and the radical polymerizable resin or compound (B).

23. The film according to claim 1, further comprising an organic compound (H) having a flux function.

24. The film according to claim 23, wherein a content of the organic compound (H) having the flux function is 5 parts by mass to 80 parts by mass based on 100 parts by mass in total of the propenyl group-containing resin (A) and the radical polymerizable resin or compound (B).

25. The film according to claim 1, having a thickness of 10 μm to 100 μm.

26. The film according to claim 1, for use in a pre-applied underfill material.

27. A laminate comprising:
a supporting material; and
a layer comprising the film according to claim 1 laminated on the supporting material.

28. A semiconductor wafer with a film layer, comprising:
a semiconductor wafer; and
the laminate according to claim 27 laminated on the semiconductor wafer,
wherein the layer comprising the film is laminated on the semiconductor wafer.

29. A substrate for mounting a semiconductor with a film layer, comprising:
a substrate for mounting the semiconductor; and
the laminate according to claim 27 laminated on the substrate for mounting the semiconductor,
wherein the layer comprising the film is laminated on the substrate for mounting the semiconductor.

30. A semiconductor device, comprising the semiconductor wafer with the film layer according to claim 28.

31. A semiconductor device, comprising the substrate for mounting the semiconductor with the film layer according to claim 29.

32. A film comprising:
- a propenyl group-containing resin (A) comprising, at an end of a molecule, a constituent unit represented by the following formula (1);
- a radical polymerizable resin or compound (B) other than the propenyl group-containing resin (A); and
- a curing accelerator (C),
- wherein the radical polymerizable resin or compound (B) comprises at least one selected from the group consisting of a maleimide group and a citraconimide group:

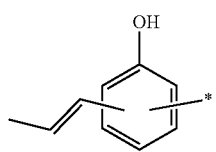

(1)

wherein—* represents a bonding hand, and
wherein the propenyl group-containing resin (A) comprises a resin represented by the following formula (2):

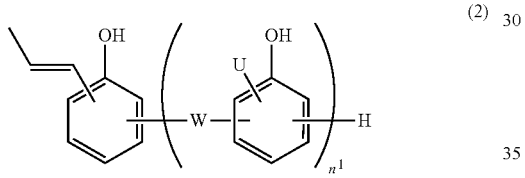

(2)

wherein each W independently represents a hydrocarbon group having 6 to 15 carbon atoms and optionally having a substituent; each U independently represents a hydrogen atom or an alkenyl group having 2 to 6 carbon atoms; and $n^1$ represents the number of repetitions, and its average value is a real number of 1 to 20.

33. A film comprising:

a propenyl group-containing resin (A) comprising, at an end of a molecule, a constituent unit represented by the following formula (1);

a radical polymerizable resin or compound (B) other than the propenyl group-containing resin (A); and a curing accelerator (C), and an organic compound (H) having a flux function, wherein the radical polymerizable resin or compound (B) comprises at least one selected from the group consisting of a maleimide group and a citraconimide group:

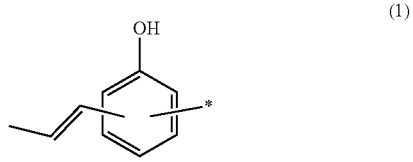

(1)

wherein—* represents a bonding hand.

* * * * *